US012765032B2

(12) United States Patent
Bae et al.

(10) Patent No.: US 12,765,032 B2
(45) Date of Patent: Oct. 13, 2026

(54) SEMICONDUCTOR DEVICES HAVING WIDE AND NARROW SOURCE DRAIN CONTACTS

(71) Applicant: SAMSUNG ELECTRONICS CO., LTD., Suwon-si (KR)

(72) Inventors: Deokhan Bae, Suwon-si (KR); Juhun Park, Seoul (KR); Yuri Lee, Hwaseong-si (KR); Yoonyoung Jung, Suwon-si (KR); Sooyeon Hong, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 934 days.

(21) Appl. No.: 17/689,721

(22) Filed: Mar. 8, 2022

(65) Prior Publication Data

US 2023/0063607 A1 Mar. 2, 2023

(30) Foreign Application Priority Data

Aug. 30, 2021 (KR) ........................ 10-2021-0114704

(51) Int. Cl.
*H10D 64/23* (2025.01)
*H10D 30/67* (2025.01)
(Continued)

(52) U.S. Cl.
CPC ....... *H10D 64/251* (2025.01); *H10D 30/6735* (2025.01); *H10D 30/6757* (2025.01); *H10D 62/118* (2025.01); *H10D 84/83* (2025.01)

(58) Field of Classification Search
CPC ............. H01L 29/417; H01L 29/41725; H01L 27/085; H01L 27/088; H01L 29/0657;
(Continued)

(56) References Cited

U.S. PATENT DOCUMENTS 9,627,510 B1 4/2017 Jagannathan et al.
9,640,436 B1 5/2017 Cheng et al.
(Continued)

FOREIGN PATENT DOCUMENTS

KR 10-2018-0035014 A 4/2018

OTHER PUBLICATIONS

Office Action in Korean Appln. No. 10-2021-0114704, mailed on Jul. 30, 2025, 13 pages (with English translation).

*Primary Examiner* — Thomas K Pham
(74) *Attorney, Agent, or Firm* — Fish & Richardson P.C.

(57) ABSTRACT

A semiconductor device includes first to fourth gate structures sequentially disposed in a first horizontal direction. Each of the first to fourth gate structures includes a gate electrode and a gate capping layer and first to third source/drain regions disposed among the first to fourth gate structures. A first narrow source/drain contact, a first wide source/drain contact, and a second narrow source/drain contact are disposed among the first to fourth gate structures and contact the first to third source/drain regions, respectively. The first to fourth gate structures are disposed with first to third distances there among. The second distance is greater than the first distance and the third distance. A lower end of the first narrow source/drain contact is disposed at a higher level than a lower end of the first wide source/drain contact.

18 Claims, 16 Drawing Sheets

(51) Int. Cl.
*H10D 62/10* (2025.01)
*H10D 84/83* (2025.01)

(58) Field of Classification Search
CPC ............. H01L 29/0665; H01L 29/4232; H01L 29/42384; H01L 29/42392; H01L 29/78; H01L 29/786; H01L 29/78696; H10D 64/251; H10D 64/256; H10D 64/258; H10D 84/013; H10D 84/0149; H10D 30/797; H10D 30/6735; H10D 30/6757; H10D 62/118; H10D 84/83; H10D 64/017; H10D 84/0135; H10D 84/0144
See application file for complete search history.

(56) References Cited

U.S. PATENT DOCUMENTS 9,691,900 B2 6/2017 Cheng et al.
9,824,920 B2 11/2017 Park et al.
9,941,274 B2 4/2018 Laven et al.
10,411,130 B2 9/2019 Liaw
2007/0114617 A1* 5/2007 Komori .............. H10D 84/0133 257/408
2009/0020830 A1* 1/2009 Anderson .............. H10D 30/60 257/386
2016/0118462 A1 4/2016 Tseng et al.
2016/0148933 A1 5/2016 Cheng et al.
2017/0018548 A1 1/2017 Laven et al.
2017/0140987 A1 5/2017 Cheng et al.
2017/0287780 A1 10/2017 Park et al.
2018/0090583 A1 3/2018 Choi et al.
2018/0331225 A1 11/2018 Liaw
2019/0305110 A1 10/2019 Chen et al.
2020/0135869 A1* 4/2020 Ciou .................... H10D 64/254
2021/0098338 A1* 4/2021 Liaw ................. H01L 21/76877
2021/0104518 A1* 4/2021 Huang ................. H10D 64/017
2021/0336020 A1* 10/2021 Yu ..................... H01L 21/76897
2022/0085011 A1* 3/2022 Lee ..................... H01L 27/0886
2022/0115508 A1* 4/2022 Lin ...................... H10D 64/258
2022/0238667 A1* 7/2022 Wang ................. H10D 30/6219

* cited by examiner

100

SEMICONDUCTOR DEVICES HAVING WIDE AND NARROW SOURCE DRAIN CONTACTS

CROSS-REFERENCE TO THE RELATED APPLICATION

This application claims priority from Korean Patent Application No. 10-2021-0114704, filed on Aug. 30, 2021, in the Korean Intellectual Property Office, the disclosure of which is incorporated herein by reference in its entirety.

BACKGROUND

1. Field

The exemplary embodiments of the disclosure relate to a semiconductor device having a gate structure.

2. Description of the Related Art

In accordance with a tendency of semiconductor devices toward miniaturization, technology associated with a Fin-FET or a multi-bridge channel FET, which has a three-dimensional structure, has been introduced in order to reduce a short channel effect of a transistor. Meanwhile, in accordance with a reduction in device size, technology for forming contacts in a further-reduced region while reducing a capacitance between the contacts is needed.

SUMMARY

The exemplary embodiments of the disclosure provide a semiconductor device including gate structures and source/drain contacts among the gate structures.

A semiconductor device according to exemplary embodiments of the disclosure may include an active region disposed on a substrate. First to fourth gate structures are sequentially disposed in a first horizontal direction and intersect the active region. Each of the first to fourth gate structures includes a gate electrode and a gate capping layer. First to third source/drain regions are sequentially disposed in the first horizontal direction among the first to fourth gate structures. A first narrow source/drain contact, a first wide source/drain contact, and a second narrow source/drain contact are sequentially disposed in the first horizontal direction among the first to fourth gate structures. The first narrow source/drain contact contacts the first source/drain region, the first wide source/drain contact contacts the second source/drain region, and the second narrow source/drain contact contacts the third source/drain region. A gate contact is disposed on the first gate structure and electrically connected to the gate electrode of the first gate structure. The first gate structure and the second gate structure may be spaced apart from each other by a first distance. The second gate structure and the third gate structure may be spaced apart from each other by a second distance greater than the first distance. The third gate structure and the fourth gate structure may be spaced apart from each other by a third distance smaller than the second distance. A lower end of the first narrow source/drain contact may be disposed at a higher level than a lower end of the first wide source/drain contact.

A semiconductor device according to exemplary embodiments of the disclosure may include an active region disposed on a substrate Channel layers are disposed on the active region and spaced apart from one another in a vertical direction. First to fourth gate structures are sequentially disposed in a first horizontal direction and intersect the active region. Each of the first to fourth gate structures includes a gate electrode surrounding the channel layers and a gate capping layer on the gate electrode. First to third source/drain regions are sequentially disposed in the first horizontal direction among the first to fourth gate structures. A first narrow source/drain contact, a first wide source/drain contact, and a second narrow source/drain contact are sequentially disposed in the first horizontal direction among the first to fourth gate structures. The first narrow source/drain contact contacts the first source/drain region, the first wide source/drain contact contacts the second source/drain region, and the second narrow source/drain contact contacts the third source/drain region. A gate contact is disposed on the first gate structure and electrically connected to the gate electrode of the first gate structure. The first gate structure and the second gate structure may be spaced apart from each other by a first distance. The second gate structure and the third gate structure may be spaced apart from each other by a second distance greater than the first distance. The third gate structure and the fourth gate structure may be spaced apart from each other by a third distance smaller than the second distance. A lower end of the first narrow source/drain contact may be disposed at a higher level than a lower end of the first wide source/drain contact.

A semiconductor device according to exemplary embodiments of the disclosure may include an active region disposed on a substrate. First to fourth gate structures are sequentially disposed in a first horizontal direction and intersect the active region. Each of the first to fourth gate structures includes a gate electrode, a gate capping layer, and a gate spacer at a side surface of the gate electrode. First to third source/drain regions are sequentially disposed in the first horizontal direction among the first to fourth gate structures. A first narrow source/drain contact, a first wide source/drain contact, and a second narrow source/drain contact are sequentially disposed in the first horizontal direction among the first to fourth gate structures. The first narrow source/drain contact contacts the first source/drain region. The first wide source/drain contact contacts the second source/drain region. The second narrow source/drain contact contacts the third source/drain region, an interlayer insulating layer covering the first to fourth gate structures, and the first to third source/drain regions. A gate contact is disposed on the first gate structure and electrically connected to the gate electrode of the first gate structure. The first gate structure and the second gate structure may be spaced apart from each other by a first distance. The second gate structure and the third gate structure may be spaced apart from each other by a second distance greater than the first distance. The third gate structure and the fourth gate structure may be spaced apart from each other by a third distance smaller than the second distance. A lower end of the first narrow source/drain contact may be disposed at a higher level than a lower end of the first wide source/drain contact. In a cross-sectional view, the first narrow source/drain contact may be lower than the gate electrode of the first gate structure and contact the gate spacer of the first gate structure. The first wide source/drain contact may contact the gate spacer and the gate capping layer of the second gate structure.

DETAILED DESCRIPTION OF EXEMPLARY EMBODIMENTS

Figure 1:
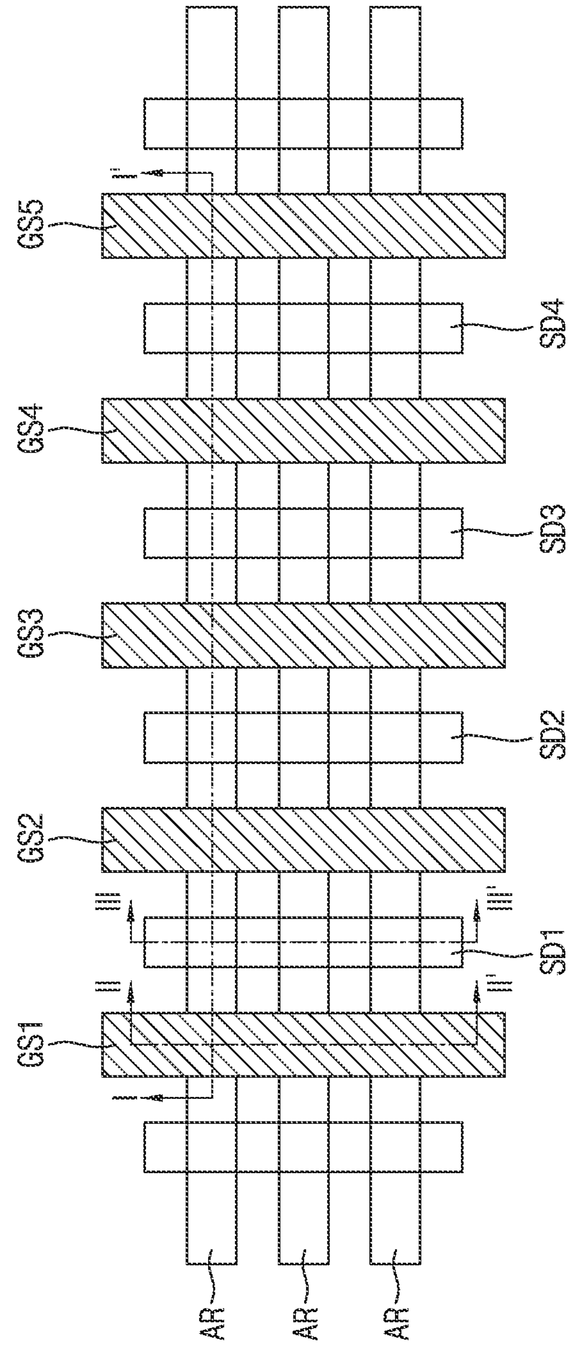
FIG. 1 is a plan view of a semiconductor device according to an exemplary embodiment of the disclosure.
Figure 2:
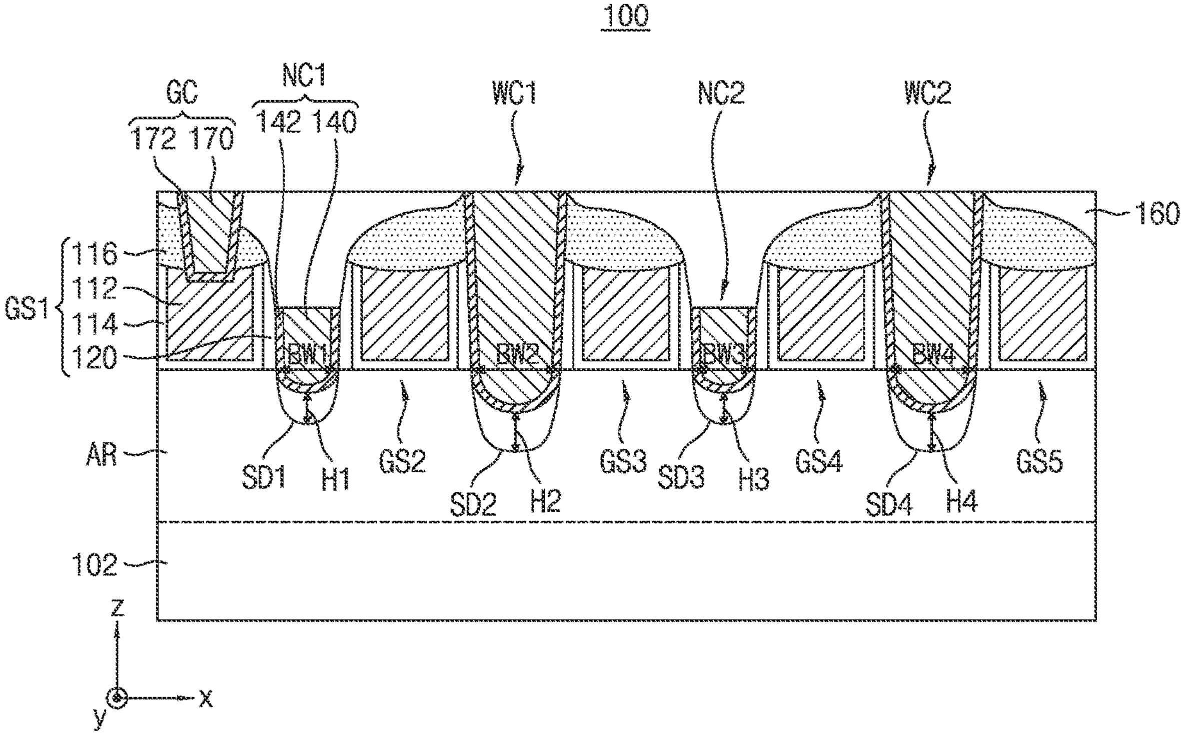
FIG. 2 is a vertical cross-sectional view of the semiconductor device taken along line I-I' in FIG. 1.
Figure 3:
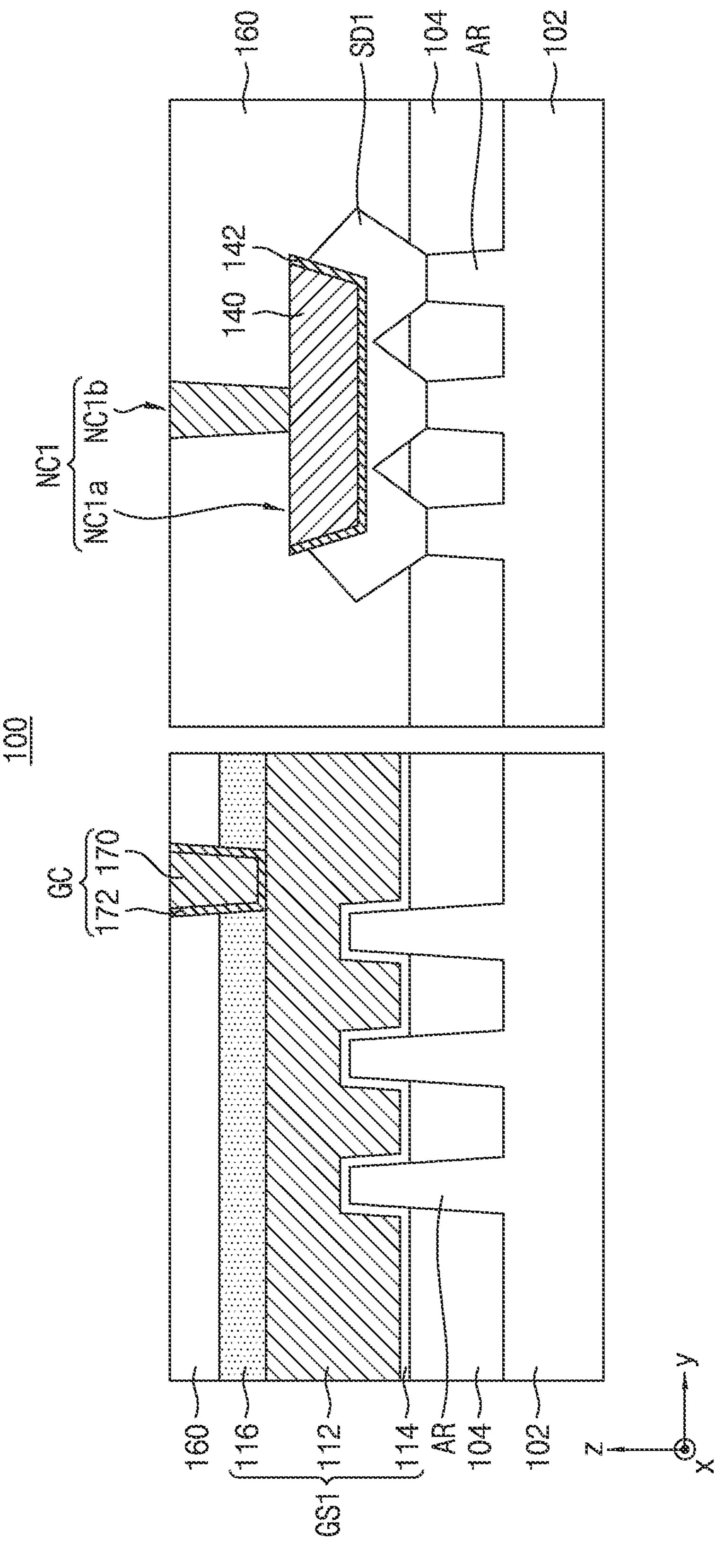
FIG. 3 is vertical cross-sectional views of the semiconductor device taken along lines II-IP and in FIG. 1.

FIG. 1 is a plan view of a semiconductor device according to an exemplary embodiment of the disclosure. FIG. 2 is a vertical cross-sectional view of the semiconductor device taken along line I-I' in FIG. 1. FIG. 3 is vertical cross-sectional views of the semiconductor device taken along lines II-II' and in FIG. 1.

Referring to FIGS. 1 to 3, a semiconductor device 100 may include a substrate 102, an element isolation layer 104, first to fifth gate structures GS1, GS2, GS3, GS4 and GS5, first to fourth source/drain regions SD1, SD2, SD3 and SD4, an interlayer insulating layer 160, a first narrow source/drain contact NC1, a first wide source/drain contact WC1, a second narrow source/drain contact NC2, a second wide source/drain contact WC2, and a gate contact GC.

The substrate 102 may include active regions AR extending in one horizontal direction, that is, an x-direction, while being spaced apart from one another in another horizontal direction, that is, a y-direction. In an embodiment, the active regions AR may protrude upwards from an upper surface of the substrate 102 and may have a fin shape. The substrate 102 may include a semiconductor material. For example, the substrate 102 may be a silicon substrate, a germanium substrate, a silicon germanium substrate, or a silicon-on-insulator (SOI) substrate. The active regions AR may include the same material as the substrate 102.

The element isolation layer 104 may be disposed at the upper surface of the substrate 102, and may define the active regions AR. The element isolation layer 104 may cover the upper surface of the substrate 102, and may partially cover side surfaces of lower portions of the active regions AR. Upper surfaces of the active regions AR may be disposed at a higher level than an upper surface of the element isolation layer 104. In an embodiment, the element isolation layer 104 may include silicon oxide, silicon nitride, silicon oxynitride, or a low-k dielectric material.

The first to fifth gate structures GS1, GS2, GS3, GS4 and GS5 may extend in the y-direction, and may be sequentially arranged in the x-direction. The first to fifth gate structures GS1, GS2, GS3, GS4 and GS5 may intersect the active regions AR. The first gate structure GS1 may include a gate electrode 112, a gate insulating layer 114, a gate capping layer 116, and a gate spacer 120. The gate insulating layer 114 may surround a bottom surface and a side surface of the gate electrode 112, and may extend in the y-direction. The gate insulating layer 114 may cover the element isolation layer 104 and a portion of the active region AR protruding above the element isolation layer 104. The gate electrode 112 may be disposed on the gate insulating layer 114 and may extend in the y-direction. The gate capping layer 116 may cover the gate electrode 112 and the gate insulating layer 114. Gate spacers 120 may be disposed at an outer surface of the first gate structure GS1 and may extend in the y-direction. For example, a pair of gate spacers 120 may be disposed to face each other under the condition that the gate electrode 112 is interposed therebetween and may contact the gate insulating layer 114. In an embodiment, the gate spacer 120 may be constituted by one or more layers. Although not shown, the first gate structure GS1 may further include a metal layer disposed between the gate insulating layer 114 and the gate electrode 112 and may be adapted to adjust a work function of the gate electrode 112.

The second to fifth gate structures GS2, GS3, GS4 and GS5 may have the same structure as the first gate structure GS1. For example, the horizontal widths of the first to fifth gate structures GS1, GS2, GS3, GS4 and GS5 in the x-direction may be equal. However, the distance of the first to fifth gate structures GS1, GS2, GS3, GS4 and GS5 may be non-uniform. As will be described later with reference to FIG. 7, in an embodiment, the first to fifth gate structures GS1, GS2, GS3, GS4 and GS5 may be alternately disposed with a short distance and a long distance. The distance between the first gate structure GS1 and the second gate structure GS2 may be smaller than the distance between the second gate structure GS2 and the third gate structure GS3. In addition, the distance between the second gate structure GS2 and the third gate structure GS3 may be smaller than the distance between the third gate structure GS3 and the fourth gate structure GS4.

The gate electrode 112 may include at least one of W, Al, Co, Ti, Ta, poly-Si, SiGe, or a metal alloy. The gate insulating layer 114 may include a material having a high dielectric constant (high-k) such as hafnium oxide, hafnium oxynitride, etc. The gate capping layer 116 may include silicon nitride, and the gate spacer 120 may include silicon oxide, silicon nitride, silicon oxynitride, or a combination thereof.

The first to fourth source/drain regions SD1, SD2, SD3 and SD4 may be disposed on the active regions AR, and may be disposed among the first to fifth gate structures GS1, GS2, GS3, GS4 and GS5. The first to fourth source/drain regions SD1, SD2, SD3 and SD4 may be semiconductor layers epitaxially grown from the active regions AR. The first to fourth source/drain regions SD1, SD2, SD3 and SD4 may apply compressive stress or tensile stress to the active regions AR and may include an n-type impurity or a p-type impurity.

In an embodiment, the sizes of the first to fourth source/drain regions SD1, SD2, SD3 and SD4 may be non-uniform. For example, a source/drain region having a relatively great volume and a source/drain region having a relatively small volume may be alternately disposed. In detail, the first source/drain region SD1 between the first gate structure GS1 and the second gate structure GS2 may be smaller than the second source/drain region SD2 between the second gate structure GS2 and the third gate structure GS3. A lower end of the first source/drain region SD1 may be disposed at a higher level than a lower end of the second source/drain region SD2, and the horizontal width of the first source/drain region SD1 may be smaller than the horizontal width of the second source/drain region SD2 at the same level. The third source/drain region SD3 between the second gate structure GS2 and the third gate structure GS3 may be smaller than the fourth source/drain region SD4 between the third gate structure GS3 and the fourth gate structure GS4. A lower end of the third source/drain region SD3 may be disposed at a higher level than a lower end of the fourth source/drain region SD4, and the horizontal width of the third source/drain region SD3 may be smaller than the horizontal width of the fourth source/drain region SD4 at the same level.

The interlayer insulating layer 160 may cover the element isolation layer 104, the first to fourth source/drain regions SD1, SD2, SD3 and SD4, the first and second narrow source/drain contacts NC1 and NC2, and gate capping layers 116. The interlayer insulating layer 160 may include silicon oxide, silicon nitride, silicon oxynitride, silicon carbide, or a low-k dielectric material and may be constituted by one or more layers. In an embodiment, the interlayer insulting layer 160 may include silicon oxycarbide.

The first narrow source/drain contact NC1, the first wide source/drain contact WC1, the second narrow source/drain contact NC2, and the second wide source/drain contact WC2 may extend through the interlayer insulating layer 160 and may be connected to the first to fourth source/drain regions SD1, SD2, SD3 and SD4, respectively. Lower ends of the first narrow source/drain contact NC1, the first wide source/drain contact WC1, the second narrow source/drain contact NC2, and the second wide source/drain contact WC2 may be disposed at a lower level than an upper surface of the active region. The first narrow source/drain contact NC1 may extend in the y-direction and may be electrically connected to the first source/drain region SD1. In addition, the first narrow source/drain contact NC1 may be disposed between the first gate structure GS1 and the second gate structure GS2 and may contact the gate spacers 120. The first narrow source/drain contact NC1 may include a contact conductive layer 140 and a contact barrier layer 142. The contact barrier layer 142 may surround a side surface and a bottom surface of the contact conductive layer 140. The contact barrier layer 142 may contact the gate spacers 120. The contact conductive layer 140 may include W, Co, Ru, Mo, or a combination thereof. The contact barrier layer 142 may include Ti, TiN, Ta, TaN, or a combination thereof. The first wide source/drain contact WC1, the second narrow source/drain contact NC2, and the second wide source/drain contact WC2 may have a structure identical or similar to the above-described structure of the first narrow source/drain contact NC1.

As shown in FIG. 2, upper surfaces of the first and second narrow source/drain contacts NC1 and NC2 may be disposed at a lower level than an upper end of at least one of the gate electrodes 112. Upper surfaces of the first and second wide source/drain contacts WC1 and WC2 may be disposed at a higher level than the upper end of at least one of the gate electrodes 112 and may be coplanar with the interlayer insulating layer 160. Further referring to FIG. 3, the first narrow source/drain contact NC1 may include a connection portion NC1*a* contacting the first source/drain region SD1 and a protrusion portion NC1*b* protruding from the connection portion NC1*a* in a vertical direction (a z-direction). The second narrow source/drain contact NC2 and the first and second wide source/drain contacts WC1 and WC2 may have a structure identical or similar to the above-described structure of the first narrow source/drain contact NC1. In other words, the cross-sectional view shown in FIG. 2 shows connection portions of the first and second narrow source/drain contacts NC1 and NC2 and shows connection portions of the first and second wide source/drain contacts WC1 and WC2.

Again referring to FIG. 2, the size of the source/drain contacts may be non-uniform. A lower end of the first narrow source/drain contact NC1 may be disposed at a higher level than a lower end of the first wide source/drain contact WC1, and a lower horizontal width BW1 of the first narrow source/drain contact NC1 may be smaller than a lower horizontal width BW2 of the first wide source/drain contact WC1. Here, "lower horizontal width" means the horizontal width of a source/drain contact at the same level as the upper surface of the active region AR. The second narrow source/drain contact NC2 may have a smaller size than the second wide source/drain contact WC2. A lower end of the second narrow source/drain contact NC2 may be disposed at a higher level than a lower end of the second wide source/drain contact WC2, and a lower horizontal width BW3 of the second narrow source/drain contact NC2 may be smaller than a lower horizontal width BW4 of the second wide source/drain contact WC2. The lower horizontal widths BW1 and BW2 of the first narrow source/drain contact NC1 and the first wide source/drain contact WC1 may be equal to the lower horizontal widths BW2 and BW4 of the second narrow source/drain contact NC2 and the second wide source/drain contact WC2, respectively, without being limited thereto.

In addition, a height H1 between the lower end of the first narrow source/drain contact NC1 and the lower end of the first source/drain region SD1 may be smaller than a height H2 between the lower end of the first wide source/drain contact WC1 and the lower end of the second source/drain region SD2. A height H3 between the lower end of the second narrow source/drain contact NC2 and the lower end of the third source/drain region SD3 may be smaller than a height H4 between the lower end of the second wide source/drain contact WC2 and the lower end of the fourth source/drain region SD4.

The gate contact GC may be disposed on the first gate structure GS1. For example, the gate contact GC may be connected to the gate electrode 112 while extending through the gate capping layer 116 and the interlayer insulating layer 160. The gate contact GC may include a gate contact conductive layer 170 and a gate barrier layer 172. The gate barrier layer 172 may surround a side surface and a bottom surface of the gate contact conductive layer 170. The gate barrier layer 172 may contact the gate electrode 112, the gate capping layer 116 and the interlayer insulating layer 160. The gate contact conductive layer 170 may include W, Co, Ru, Mo, or a combination thereof. The gate barrier layer 172 may include Ti, TiN, Ta, TaN, or a combination thereof.

FIGS. 4 to 16 are vertical cross-sectional views illustrating, in process order, a method of manufacturing the semiconductor device shown in FIGS. 1 to 3.

Figure 4:
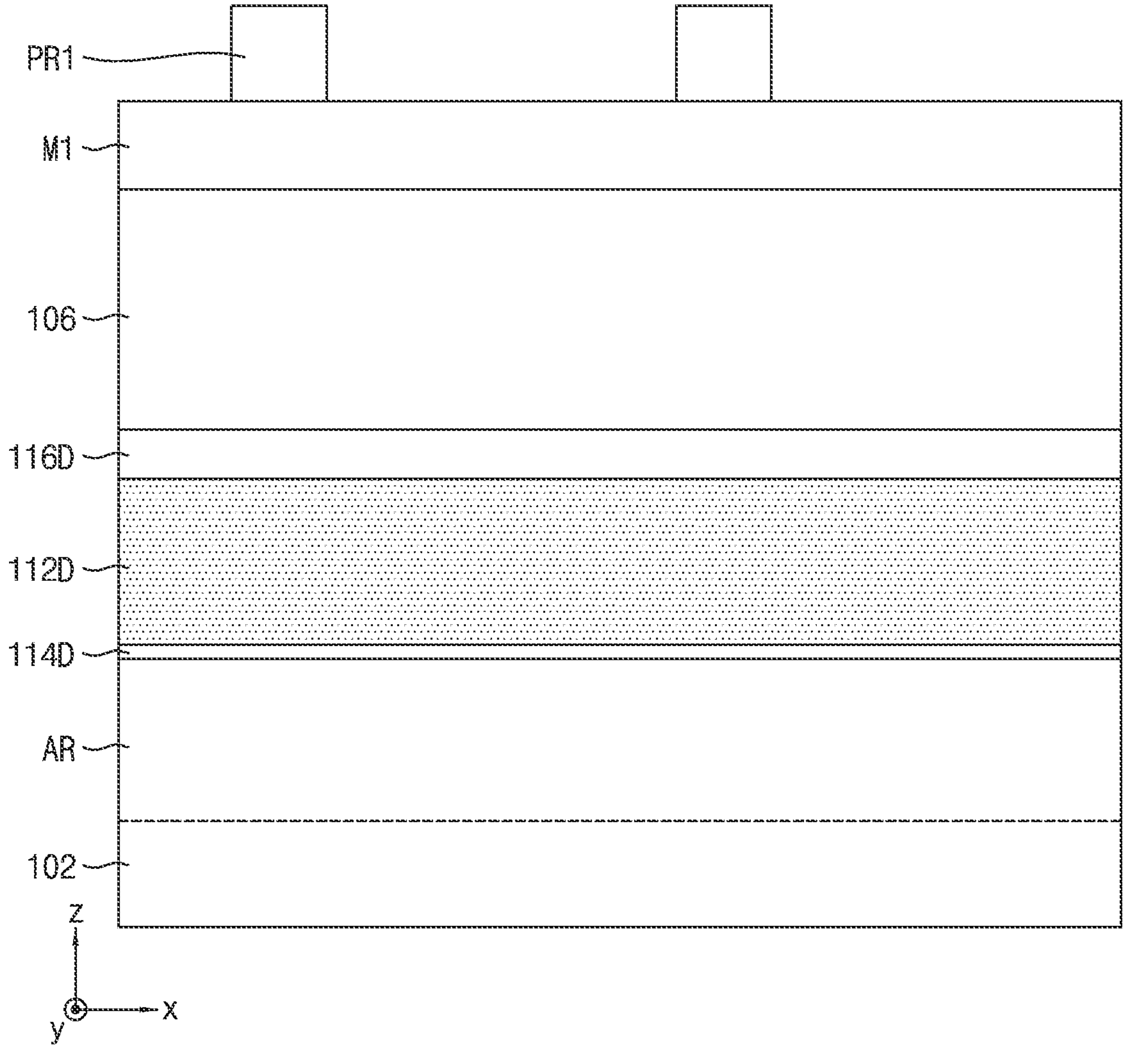
FIGS. 4 to 16 are vertical cross-sectional views illustrating, in process order, a method of manufacturing the semiconductor device shown in FIGS. 1 to 3.

Referring to FIG. 4, a substrate 102, an active region AR on the substrate 102, a dummy gate insulating layer 114D, a dummy gate electrode 112D, a dummy gate capping layer 116D, a sacrificial layer 106, a mask layer M1 and a photoresist PR1, which are sequentially stacked on the active region AR, may be provided. The active region AR may be formed by patterning the substrate 102. For example, an active region AR extending in an x-direction may be formed by anisotropically etching the substrate 102, and a plurality of active regions AR may be spaced apart from one another in a y-direction intersecting the x-direction. Thereafter, an element isolation layer 104 may be formed to cover an upper surface of the substrate 102 and lower portions of the active regions AR.

The dummy gate insulating layer 114D, the dummy gate electrode 112D and the dummy gate capping layer 116D may be formed by depositing an insulating material and a dummy gate material to cover the substrate 102 and the active region AR after formation of the active region AR. The dummy gate insulating layer 114D, the dummy gate electrode 112D and the dummy gate capping layer 116D may be formed through a method such as chemical vapor deposition (CVD) or atomic layer deposition (ALD).

The dummy gate insulating layer 114D may include silicon oxide, and the dummy gate electrode 112D may include polysilicon. The dummy gate capping layer 116D may include silicon nitride, silicon oxynitride, or a combination thereof.

The sacrificial layer 106 and the mask layer M1 may be sequentially deposited on the dummy gate capping layer 116D. In an embodiment, the sacrificial layer 106 may include polysilicon, and the mask layer M1 may include a spin-on hardmask (SOH). The photoresist PR1 may be formed on the mask layer M1, and may partially expose the mask layer M1.

Figure 5:
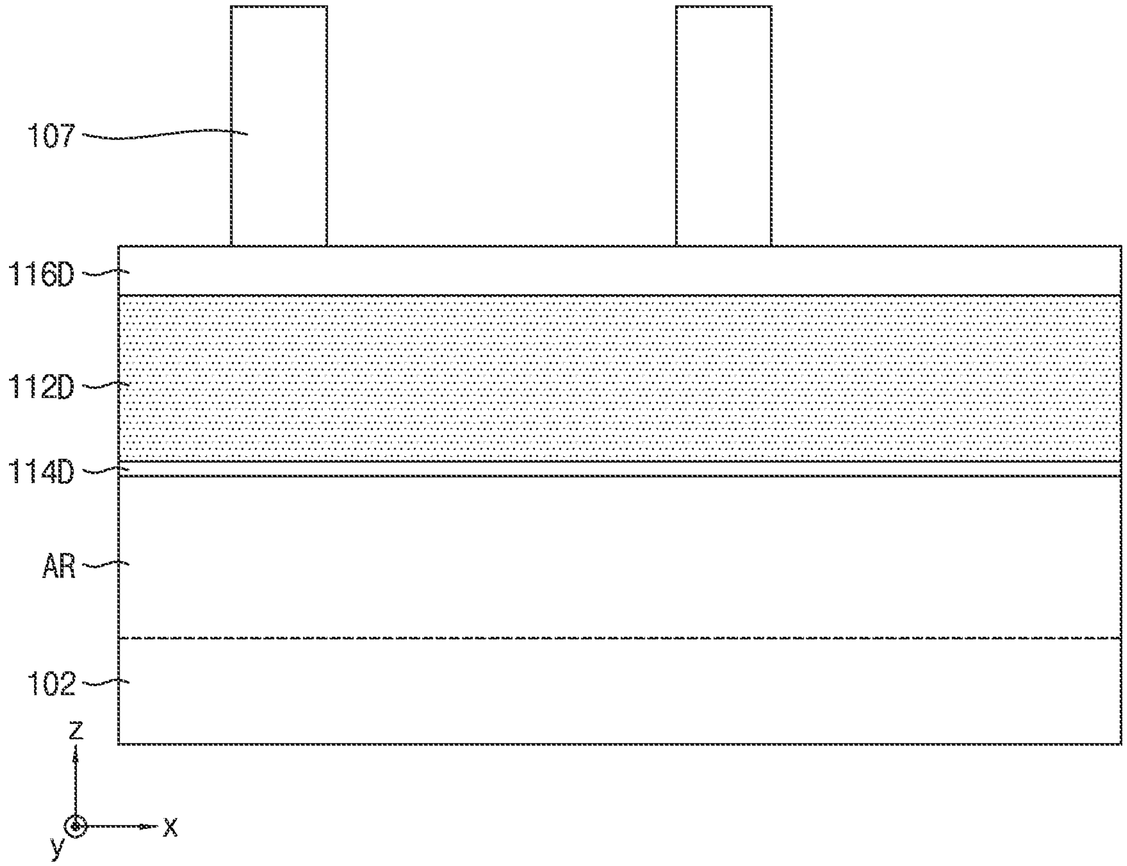

Referring to FIG. 5 the sacrificial layer 106 may be etched, thereby forming a sacrificial pattern 107. The sacrificial pattern 107 may be formed by patterning the mask layer M1 by an etching process using the photoresist PR1 as an etch mask and then etching the sacrificial layer 106 using the patterned mask layer M1 as an etch mask. The dummy gate capping layer 116D may remain without being removed in the etching process. The sacrificial pattern 107 may extend in the y-direction.

Figure 6:
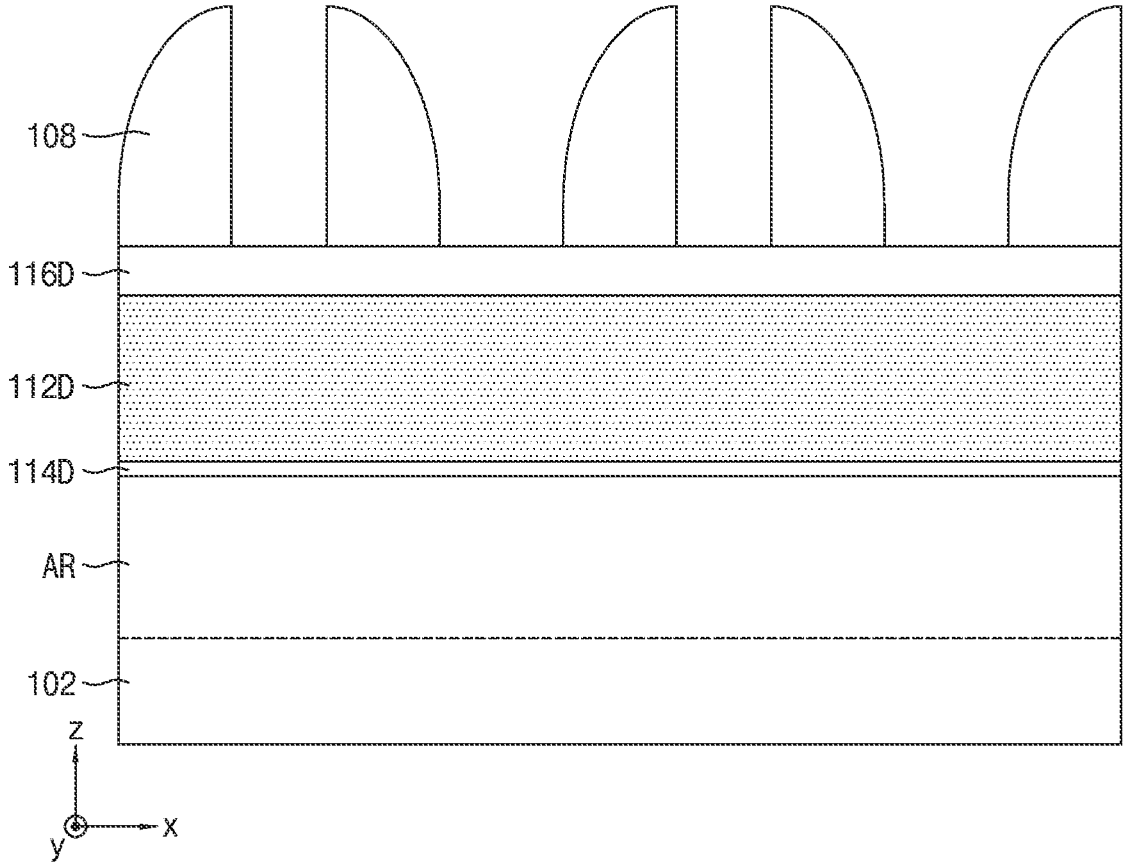

Referring to FIG. 6, a spacer 108 may be formed on the dummy gate capping layer 116D. The spacer 108 may be formed by conformally forming an insulating material on the resultant structure of FIG. 5 through a method such as ALD, etc., and then anisotropically etching the insulating material. The spacer 108 may be formed at a side wall of the sacrificial pattern 107 shown in FIG. 5, and may extend in the y-direction. In an embodiment, spacers 108 may be spaced apart from one another by a uniform distance in the x-direction. The spacer 108 may include silicon oxide. After formation of the spacer 108, the sacrificial pattern 107 may be removed.

Figure 7:
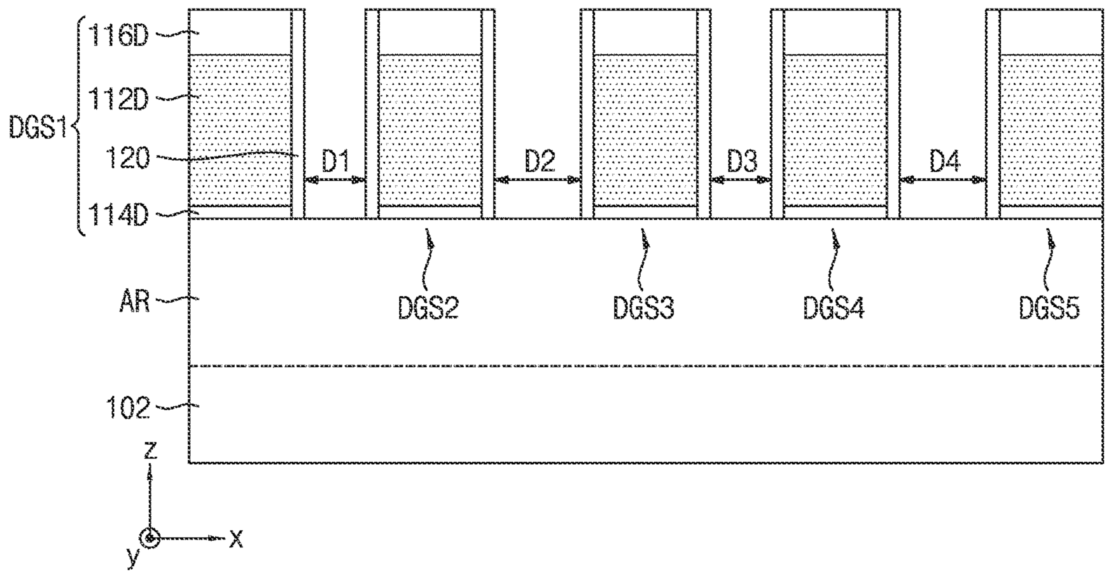

Referring to FIG. 7, the dummy gate electrode 112D, the dummy gate insulating layer 114D, and the dummy gate capping layer 116D may be etched by performing an etching process using the spacer 108 shown in FIG. 6 as an etch mask. Subsequently, gate spacers 120 may be formed at side surfaces of the dummy gate electrode 112D, the dummy gate insulating layer 114D and the dummy gate capping layer 116D. The gate spacer 120 may be formed by conformally forming an insulating material to cover the dummy gate electrode 112D, the dummy gate insulating layer 114D and the dummy gate capping layer 116D, and then anisotropically etching the insulating material. The gate spacer 120 may include silicon nitride, silicon oxycarbonitride, or a combination thereof.

As the gate spacer 120 is formed, first to fifth dummy gate structures DGS1, DGS2, DGS3, DGS4 and DGS5 may be formed on the active region AR, to be sequentially disposed in the x-direction. The dummy gate electrode 112D, the dummy gate insulating layer 114D, the dummy gate capping layer 116D, and the gate spacer 120 may constitute the first dummy gate structure DGS1, and the second to fifth dummy gate structures DGS2, DGS3, DGS4 and DGS5 may have the same structure as the first dummy gate structure DGS1. The first to fifth dummy gate structures DGS1, DGS2, DGS3, DGS4 and DGS5 may extend in the y-direction while intersecting the active region AR. In addition, horizontal widths of the first to fifth dummy gate structures DGS1, DGS2, DGS3, DGS4 and DGS5 in the x-direction may be substantially equal.

In an embodiment, a part of the dummy gate structures may be disposed with a non-uniform distance due to process deviation in a manufacturing process for the semiconductor device. For example, the distance among the first to fifth dummy gate structures DGS1, DGS2, DGS3, DGS4 and DGS5 may be non-uniform. Here, the distance among the dummy gate structures may mean the horizontal distance in the x-direction between the gate spacers 120 of adjacent ones of the dummy gate structures. In an embodiment, the first to fifth dummy gate structures DGS1, DGS2, DGS3, DGS4 and DGS5 may be alternately disposed with a short distance and a long distance. A first distance D1 between the first dummy gate structure DGS1 and the second dummy gate structure DGS2 may be smaller than a second distance D2 between the second dummy gate structure DGS2 and the third dummy gate structure DGS3. In addition, a third distance D3 between the second dummy gate structure DGS2 and the third dummy gate structure DGS3 may be smaller than a fourth distance D4 between the third dummy gate structure DGS3 and the fourth dummy gate structure DGS4. Although not shown, the distance among dummy gates disposed with a uniform distance in another region of the semiconductor device may be greater than the first distance D1 and the third distance D3, but smaller than the second distance D2 and the fourth distance D4. The first distance D1 and the second distance D2 may be equal to the third distance D3 and the fourth distance D4, respectively, without being limited thereto.

Figure 8:
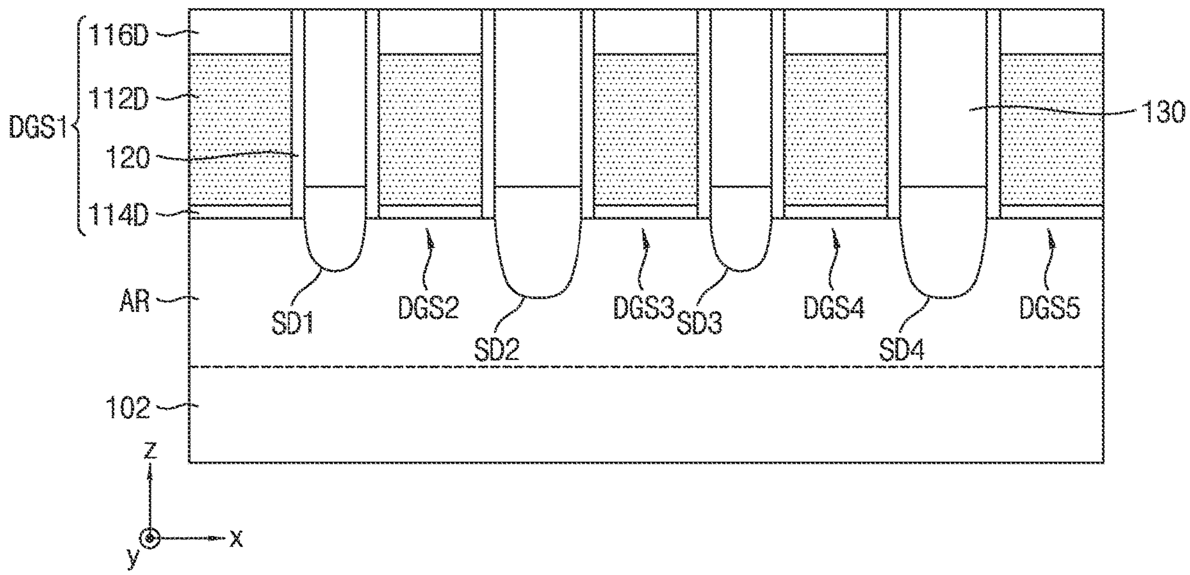

Referring to FIG. 8, first to fourth source/drain regions SD1, SD2, SD3 and SD4 may be formed among the first to fifth dummy gate structures DGS1, DGS2, DGS3, DGS4 and DGS5. The first to fourth source/drain regions SD1, SD2, SD3 and SD4 may be formed at the active region AR by an epitaxial process and may be upwardly and downwardly grown from an upper surface of the active region AR. In an embodiment, the sizes of the first to fourth source/drain regions SD1, SD2, SD3 and SD4 may be non-uniform. For example, a source/drain region having a relatively great volume and a source/drain region having a relatively small volume may be alternately disposed. In detail, the first source/drain region SD1 between the first dummy gate structure DGS1 and the second dummy gate structure DGS2 may be smaller than the second source/drain region SD2 between the second dummy gate structure DGS2 and the third dummy gate structure DGS3. A lower end of the second source/drain region SD2 may be lower than a lower end of the first source/drain region SD1, and the horizontal width of the second source/drain region SD2 may be greater than the horizontal width of the first source/drain region SD1. The third source/drain region SD3 between the second dummy gate structure DGS2 and the third dummy gate structure DGS3 may be smaller than the fourth source/drain region SD4 between the third dummy gate structure DGS3 and the fourth dummy gate structure DGS4. A lower end of the fourth source/drain region SD4 may be lower than a lower end of the third source/drain region SD3, and the horizontal width of the fourth source/drain region SD4 may be greater than the horizontal width of the third source/drain region SD3. Although not shown, the size of source/drain regions uniformly formed in another region of the semiconductor device may be greater than the first source/drain region SD1 and the third source/drain region SD3, but smaller than the second source/drain region SD2 and the fourth source/drain region SD4. The sizes of the first source/drain region SD1 and the second source/drain region SD2 may be equal to the sizes of the third source/drain region SD3 and the fourth source/drain region SD4, respectively, without being limited thereto.

Thereafter, an interlayer insulating layer 130 may be formed. The interlayer insulating layer 130 may be formed by forming an insulating material to cover the first to fifth dummy gate structures DGS1, DGS2, DGS3, DGS4 and DGS5 and the first to fourth source/drain regions SD1, SD2, SD3 and SD4, and then performing a planarization process to expose dummy gate capping layers 116D. An upper surface of the interlayer insulating layer 130 may be coplanar with an upper surface of the dummy gate capping layer 116D. Since the distance among the first to fifth dummy gate structures DGS1, DGS2, DGS3, DGS4 and DGS5 is non-uniform, as described above, the size of interlayer insulating layers 130 disposed among the dummy gate structures DGS1, DGS2, DGS3, DGS4 and DGS5 may be non-uniform. The interlayer insulating layer 130 may include silicon oxide.

Figure 9:
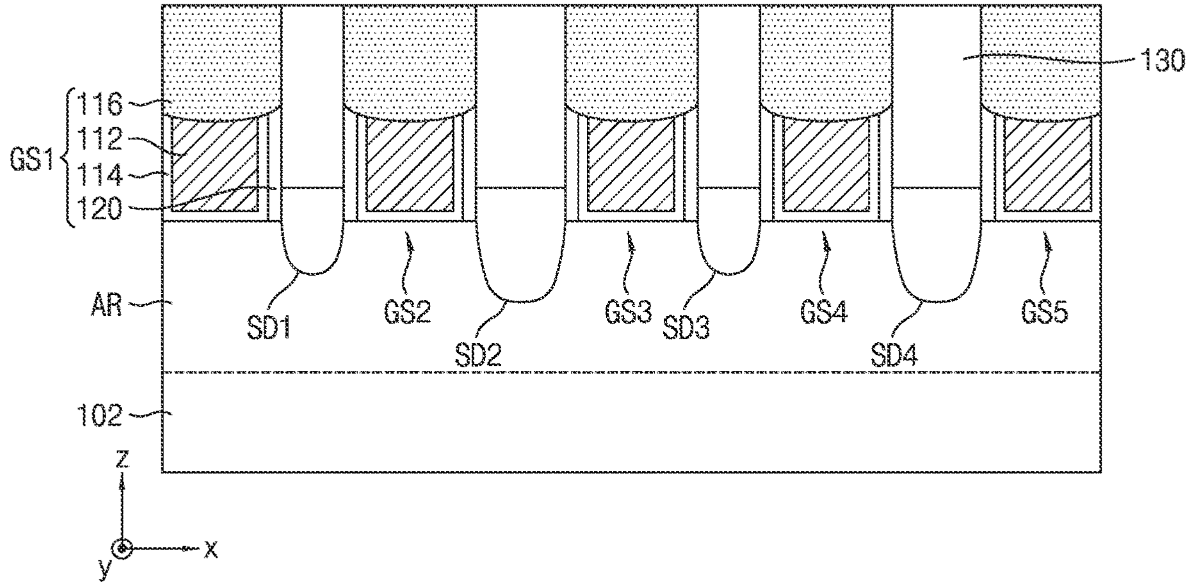

Referring to FIG. 9, the first to fifth dummy gate structures DGS1, DGS2, DGS3, DGS4 and DGS5 may be replaced by first to fifth gate structures GS1, GS2, GS3, GS4 and GS5. In an embodiment, the first to fifth gate structures GS1, GS2, GS3, GS4 and GS5 may be formed by a replacement metal gate (RMG) process. For example, the first gate structure GS1 may be formed by removing the dummy gate electrode 112D, the dummy gate insulating layer 114D and the dummy gate capping layer 116D of the first dummy gate structure DGS1, depositing an insulating material and a conductive material between the gate spacers 120, and then depositing a capping material. The first gate structure GS1 may include a gate electrode 112 between the gate spacers 120, a gate insulating layer 114 covering a side surface and a bottom surface of the gate electrode 112, and a gate capping layer 116 covering an upper surface of the gate electrode 112. The second to fifth gate structures GS2, GS3, GS4 and GS5 may include the same structure as the first gate structure GS1.

Figure 10:
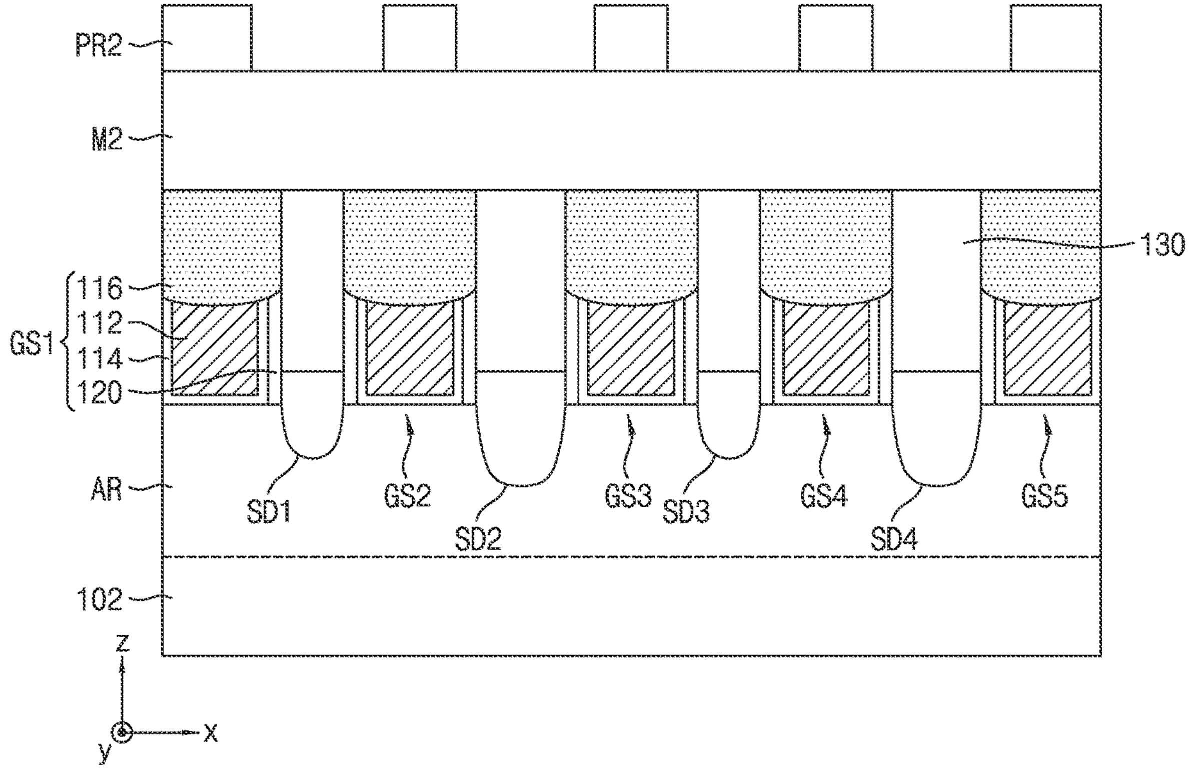

Referring to FIG. 10, a mask layer M2 and a photoresist PR2 may be formed on the resultant structure of FIG. 9. The photoresist PR2 may expose portions of an upper surface of the mask layer M2 corresponding to the first to fourth source/drain regions SD1, SD2, SD3 and SD4.

Figure 11:
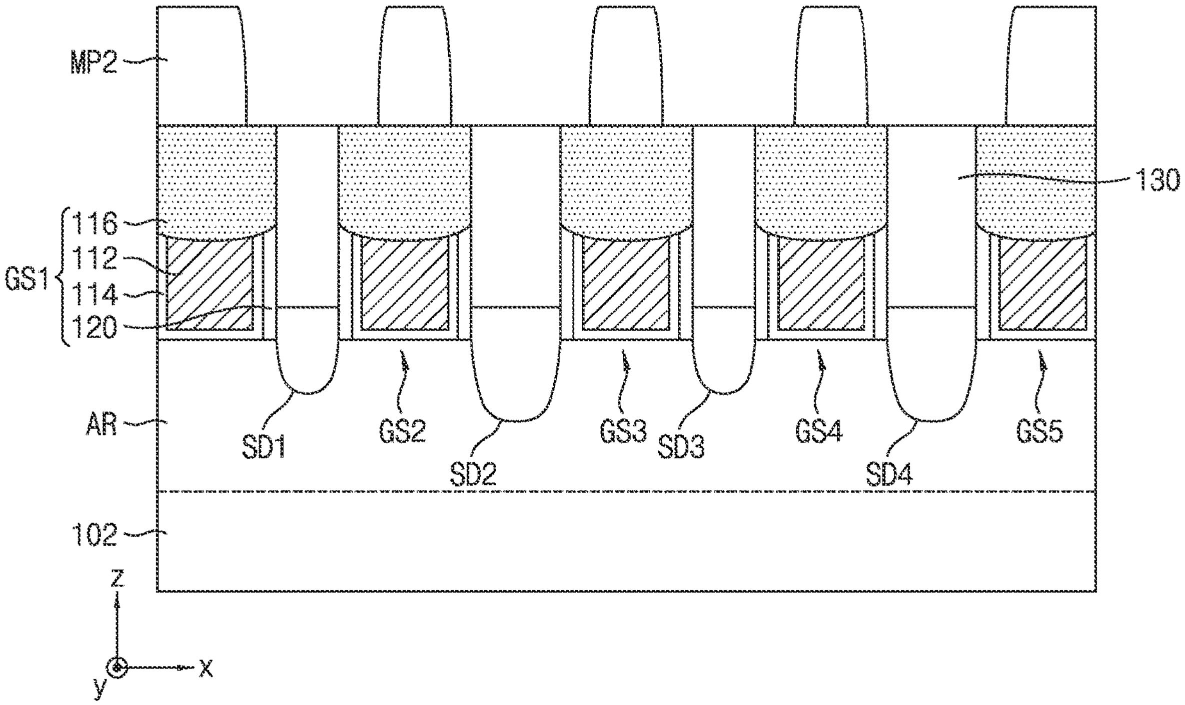

Referring to FIG. 11, an etching process using the photoresist PR2 as an etch mask may be performed and, as such, the mask layer M2 may be etched, thereby forming mask patterns MP2. The mask patterns MP2 may be spaced apart from one another by a uniform distance, and portions of gate capping layers 116 and interlayer insulating layers 130 may be exposed.

Figure 12:
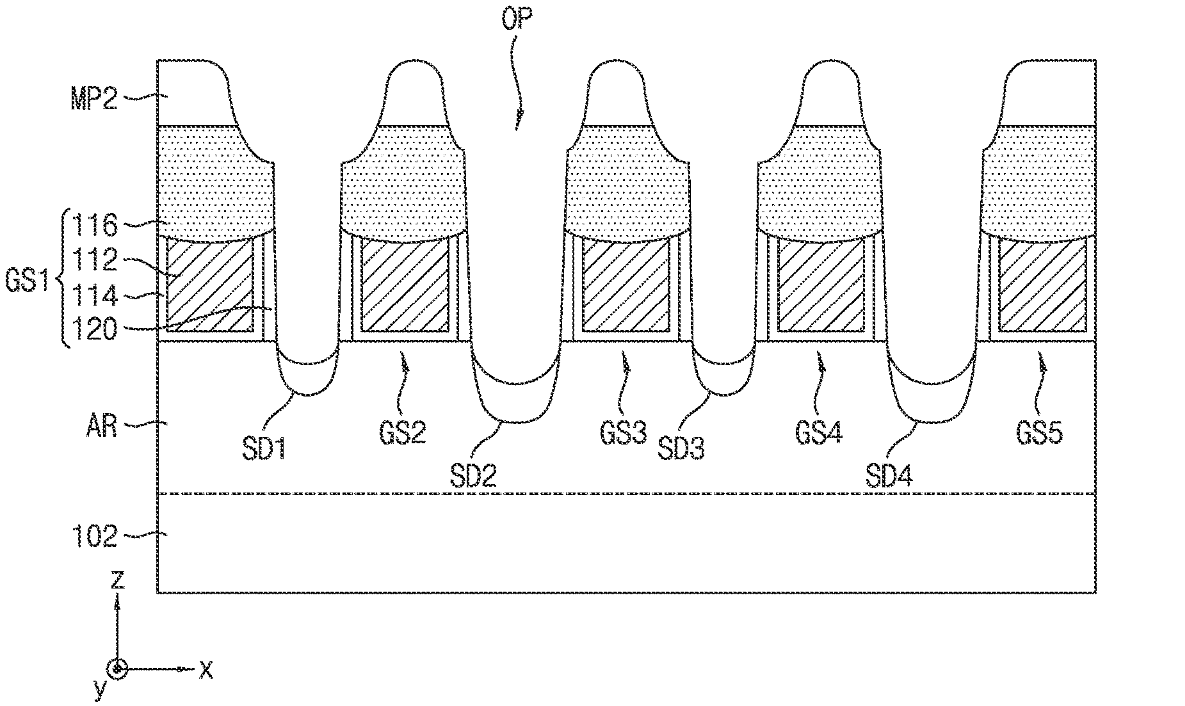

Referring to FIG. 12, an anisotropic etching process using the mask pattern MP2 as an etch mask may be performed, thereby forming openings OP among the gate capping layers 116. The interlayer insulating layer 130 may be removed by the etching process, and the first to fourth source/drain regions SD1, SD2, SD3 and SD4 may be exposed to the openings OP. In an embodiment, upper surfaces of the first to fourth source/drain regions SD1, SD2, SD3 and SD4 may be partially etched, and the openings OP may further extend downwards from the upper surface of the active region AR. In addition, upper portions of the gate capping layers 116 may be partially removed by the etching process.

Figure 13:
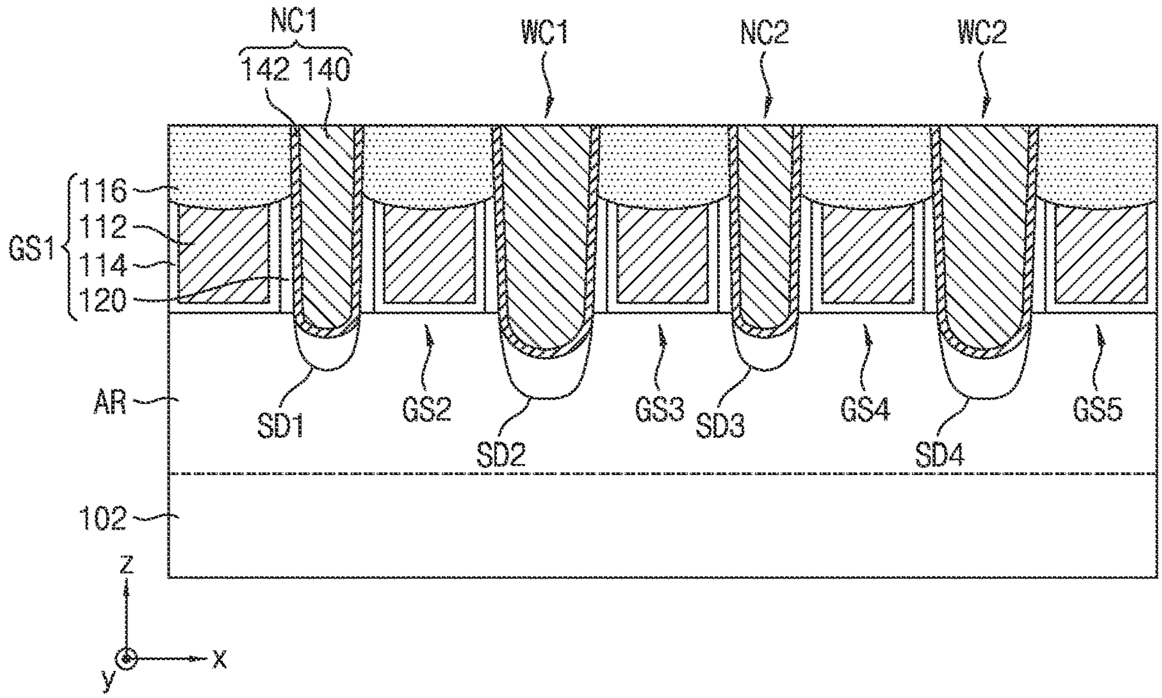

Referring to FIG. 13, a barrier material and a conductive material may be formed to fill the openings OP and a planarization process may then be performed to expose upper surfaces of the gate capping layers 116, thereby forming a first narrow source/drain contact NC1, a first wide source/drain contact WC1, a second narrow source/drain contact NC2, and a second wide source/drain contact WC2. The first narrow source/drain contact NC1 may include a contact conductive layer 140 and a contact barrier layer 142 covering a side surface and a bottom surface of the contact conductive layer 140. Upper surfaces of the contact conductive layer 140 and the contact barrier layer 142 may be coplanar with the upper surface of the gate capping layer 116.

The first narrow source/drain contact NC1, the first wide source/drain contact WC1, the second narrow source/drain contact NC2, and the second wide source/drain contact WC2 may contact the first source/drain region SD1, the second source/drain region SD2, the third source/drain region SD3, and the fourth source/drain region SD4, respectively, while directly contacting corresponding ones of the gate spacers 120. The first wide source/drain contact WC1, the second narrow source/drain contact NC2, and the second wide source/drain contact WC2 may have the same structure as the first narrow source/drain contact NC1. The contact conductive layer 140 may include W, Co, Ru, Mo, or a combination thereof. The contact barrier layer 142 may include Ti, TiN, Ta, TaN, or a combination thereof.

In an embodiment, the size of the source/drain contacts may be non-uniform. For example, a source/drain contact having a relatively great volume and a source/drain contact having a relatively small volume may be alternately disposed. In detail, the size of the first narrow source/drain contact NC1 between the first gate structure GS1 and the second gate structure GS2 may be smaller than the size of the first wide source/drain contact WC1 between the second gate structure GS2 and the third gate structure GS3. A lower end of the first wide source/drain contact WC1 may be lower than a lower end of the first narrow source/drain contact NC1, and the horizontal width of the first wide source/drain contact WC1 may be greater than the horizontal width of the first narrow source/drain contact NC1. The size of the second narrow source/drain contact NC2 between the second gate structure GS2 and the third gate structure GS3 may be smaller than the size of the second wide source/drain contact WC2 between the third gate structure GS3 and the fourth gate structure GS4. A lower end of the second wide source/drain contact WC2 may be lower than a lower end of the second narrow source/drain contact NC2, and the horizontal width of the second wide source/drain contact WC2 may be greater than the horizontal width of the first wide source/drain contact WC1. Although not shown, the size of source/drain contacts uniformly formed in another region of the semiconductor device may be greater than the first narrow source/drain contact NC1 and the second narrow source/drain contact NC2, but smaller than the first wide source/drain contact WC1 and the second wide source/drain contact WC2. The sizes of the first narrow source/drain contact NC1 and the first wide source/drain contact WC1 may be equal to the sizes of the second narrow source/drain contact NC2 and the second wide source/drain contact WC2, respectively, without being limited thereto.

As shown in FIG. 11, the distance among the mask patterns MP2 may not be equal to the horizontal width of the interlayer insulating layer 130, and the interlayer insulating layers 130 may not be aligned with an x-direction center of the mask patterns MP2 adjacent thereto. However, the gate capping layer 116 has etch selectivity with respect to the interlayer insulating layer 130 and, as such, in the etching process described with reference to FIG. 12, the openings may be aligned with the first to fourth source/drain regions SD1, SD2, SD3 and SD4 in a vertical direction (a z-direction), respectively. Accordingly, even when distances among the first to fifth gate structures GS1, GS2, GS3, GS4 and GS5 are non-uniformly formed, the first narrow source/drain contact NC1, the first wide source/drain contact WC1, the second narrow source/drain contact NC2, and the second wide source/drain contact WC2 may completely fill spaces among the first to fifth gate structures GS1, GS2, GS3, GS4 and GS5, and may align with the first to fourth source/drain regions SD1, SD2, SD3 and SD4 in the vertical direction.

Figure 14:
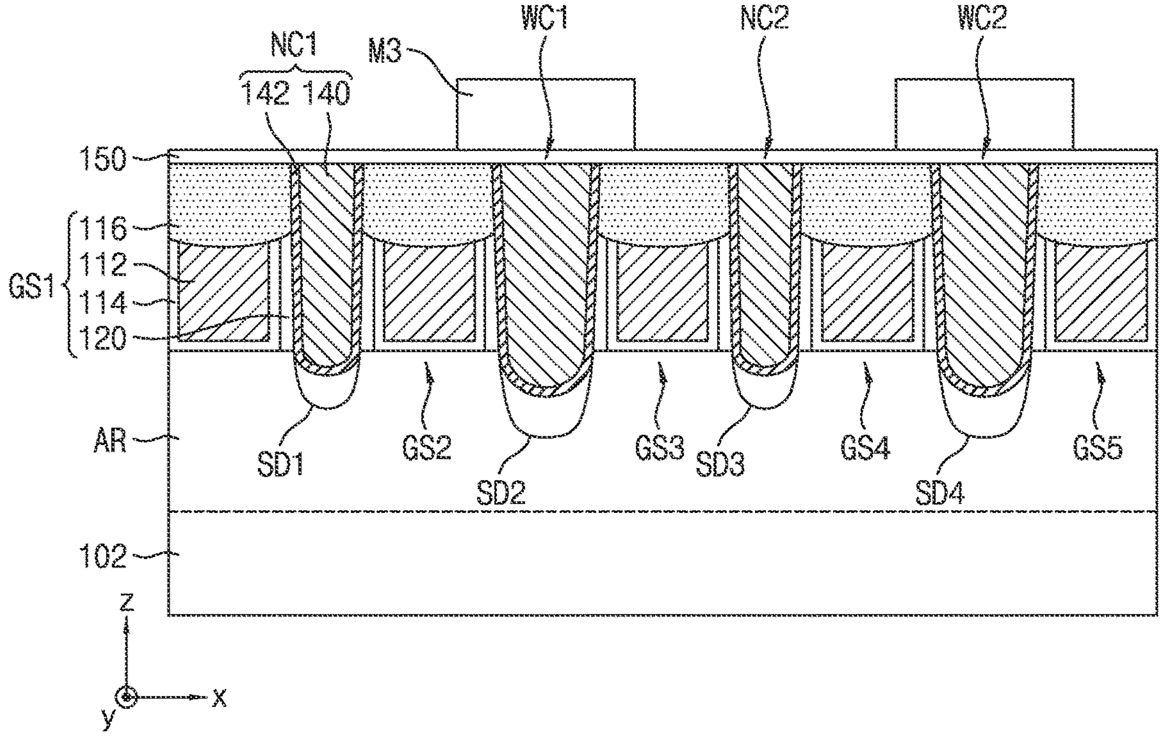

Referring to FIG. 14, an etch stop layer 150 and a mask layer M3 may be formed on the resultant structure of FIG. 13. The etch stop layer 150 may include silicon oxycarbide (SiOC), silicon carbide (SiC), or a combination thereof. The mask layer M3 may be formed on the etch stop layer 150 and may be disposed on portions of the etch stop layer 150 corresponding to the first wide source/drain contact WC1 and the second wide source/drain contact WC2.

Figure 15:
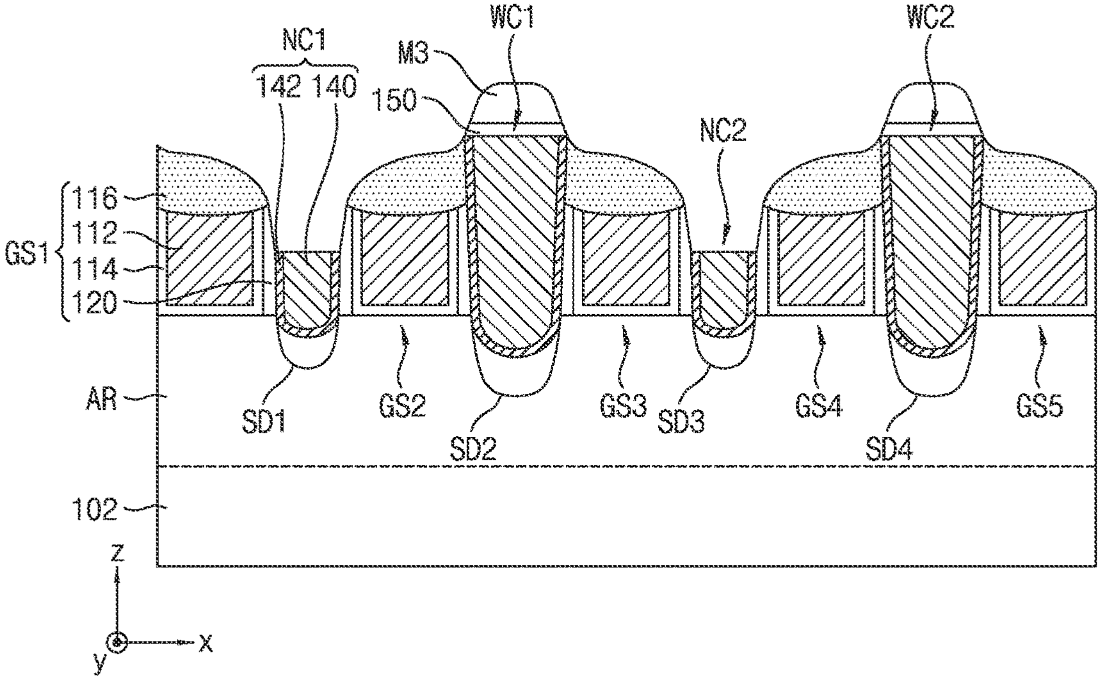

Referring to FIG. 15, an etching process using the mask layer M3 as an etch mask may be performed, thereby partially removing upper portions of the first narrow source/drain contact NC1 and the second narrow source/drain contact NC2. Upper surfaces of the first narrow source/drain contact NC1 and the second narrow source/drain contact NC2 after the etching process may be disposed at a lower level than an upper end of at least one of the gate electrodes 112. An upper end of the gate capping layer 116 may be partially removed by the etching process. As described with reference to FIG. 3, FIG. 15 shows connection portions of the first and second narrow source/drain contacts NC1 and NC2 and shows protrusion portions of the first and second wide source/drain contacts WC1 and WC2.

Figure 16:
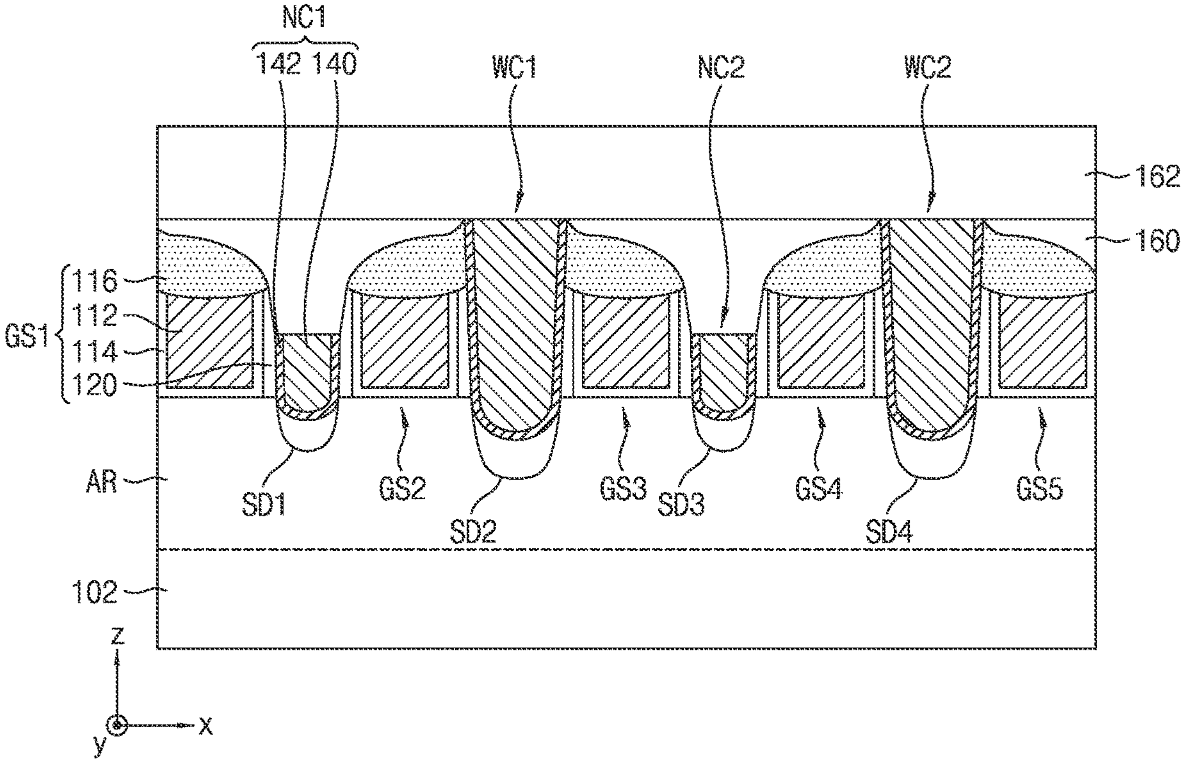

Referring to FIG. 16, an interlayer insulating layer 160 and an upper insulating layer 162 may be deposited. The interlayer insulating layer 160 may be formed by forming an insulating material covering the resultant structure of FIG. 15 and then performing a planarization process to expose upper surfaces of the first wide source/drain contact WC1 and the second wide source/drain contact WC2. The upper insulating layer 162 may be disposed on the interlayer insulating layer 160. In an embodiment, the interlayer insulating layer 160 may include silicon oxycarbide, and the upper insulating layer 162 may include silicon oxide.

Again referring to FIGS. 1 to 3, a gate contact GC may be formed on the first gate structure GS1. The gate contact GC may be formed by etching the gate capping layer 116, the interlayer insulating layer 160 and the upper insulating layer 162 such that an upper surface of the gate structure is exposed, thereby forming an opening, and then depositing a barrier material and a conductive material in the opening. Thereafter, a planarization process may be formed such that an upper surface of the gate contact GC is coplanar with an upper surface of the interlayer insulating layer 160 and the upper surfaces of the first wide source/drain contact WC1 and the second wide source/drain contact WC2, and the upper insulating layer 162 may be removed. The gate contact GC may include a gate contact conductive layer 170 and a gate barrier layer 172 covering a bottom surface and a side surface of the gate contact conductive layer 170. The gate contact conductive layer 170 may include W, Co, Ru, Mo, or a combination thereof. The gate barrier layer 172 may include Ti, TiN, Ta, TaN, or a combination thereof.

Figure 17:
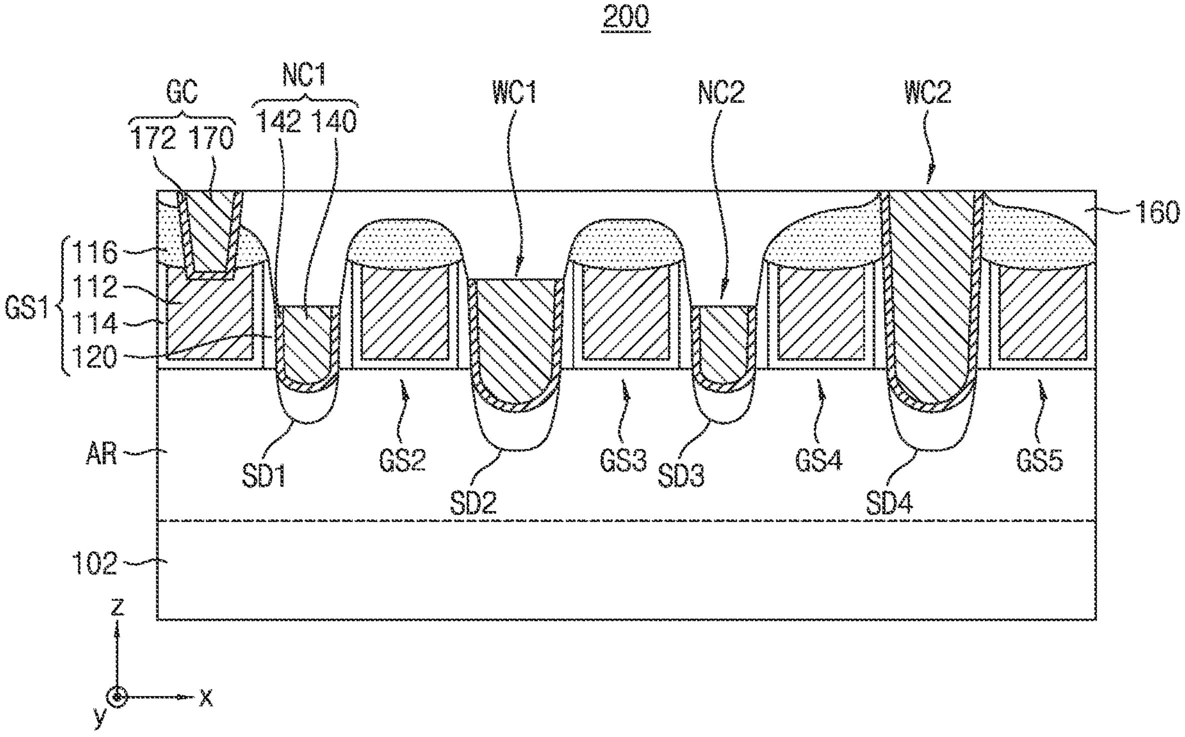
FIGS. 17 and 18 are vertical cross-sectional views of a semiconductor device according to an exemplary embodiment of the disclosure.
Figure 18:
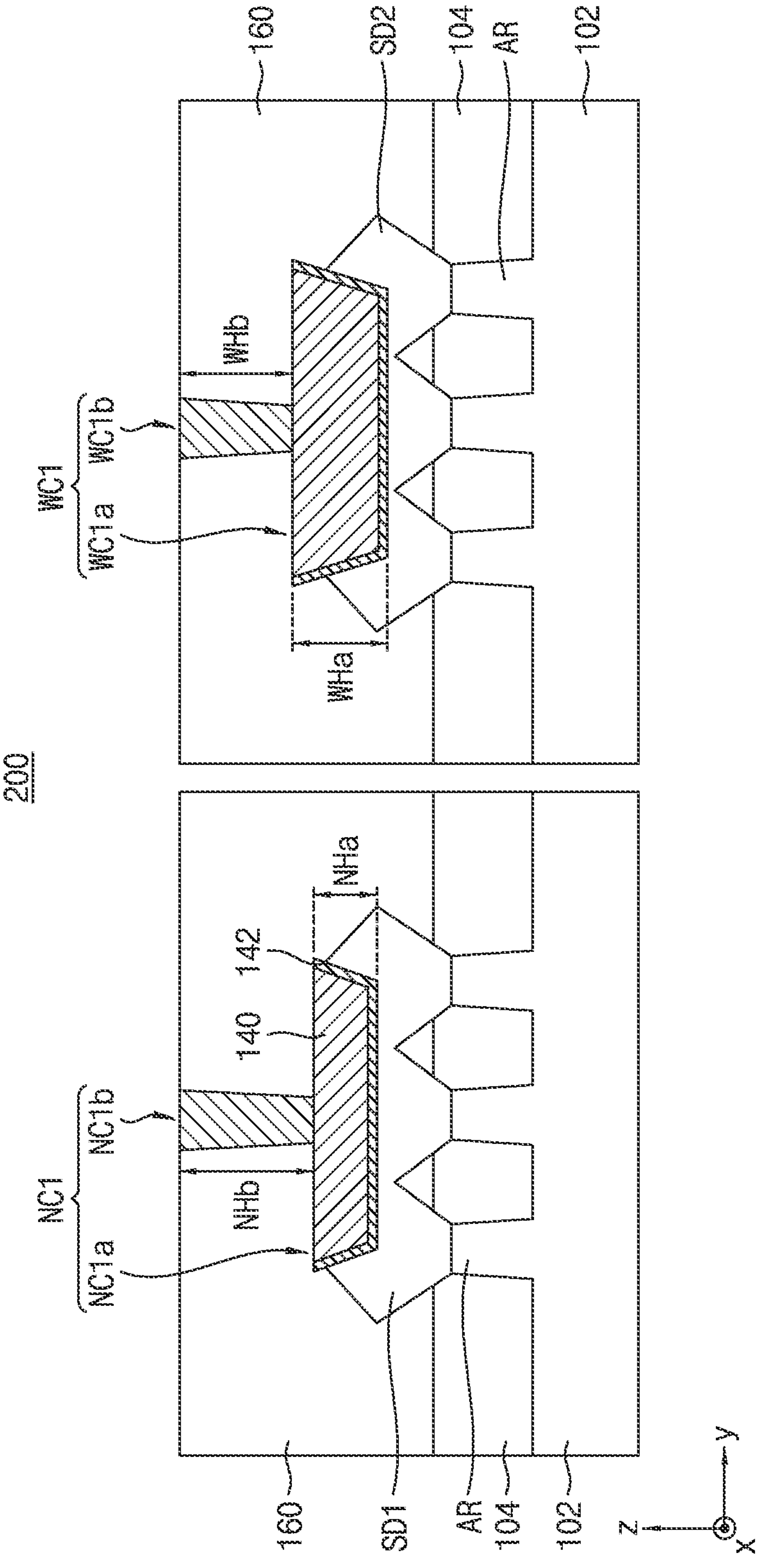

FIGS. 17 and 18 are vertical cross-sectional views of a semiconductor device according to an exemplary embodiment of the disclosure. In detail, FIG. 18 is a vertical cross-sectional view of a first narrow source/drain contact NC1 and a first wide source/drain contact WC1 viewed in a yz plane.

Referring to FIG. 17, a semiconductor device 200 may include the first narrow source/drain contact NC1 and the first wide source/drain contact WC1 which are connected to first and second source/drain regions SD1 and SD2, respectively. FIG. 17 shows connection portions of the first narrow source/drain contact NC1 and the first wide source/drain contact WC1. In cross-sectional view, an upper surface of the first narrow source/drain contact NC1, an upper surface of a second narrow source/drain contact NC2, and an upper surface of the first wide source/drain contact WC1 may be disposed at a lower level than an upper end of at least one of gate electrodes 112.

In the etching process described with reference to FIG. 15, the first and second narrow source/drain contacts NC1 and NC2 may be etched deeper than the first wide source/drain contact WC1. For example, an upper surface of a connection portion NC1*a* of the first narrow source/drain contact NC1 may be disposed at a lower level than an upper surface of a connection portion WC1*a* of the first wide source/drain contact WC1. A height NHa of the connection portion NC1*a* of the first narrow source/drain contact NC1 may be smaller than a height WHa of the connection portion WC1*a* of the first wide source/drain contact WC1. A height NHb of a protrusion portion NC1*b* of the first narrow source/drain contact NC1 may be greater than a height WHb of a protrusion portion WC1*b* of the first wide source/drain contact WC1. An upper surface of the protrusion portion NC1*b* of the first narrow source/drain contact NC1 and an upper surface of the protrusion portion WC1*b* of the first wide source/drain contact WC1 may be disposed at the same level as an upper surface of an interlayer insulating layer 160.

Figure 19:
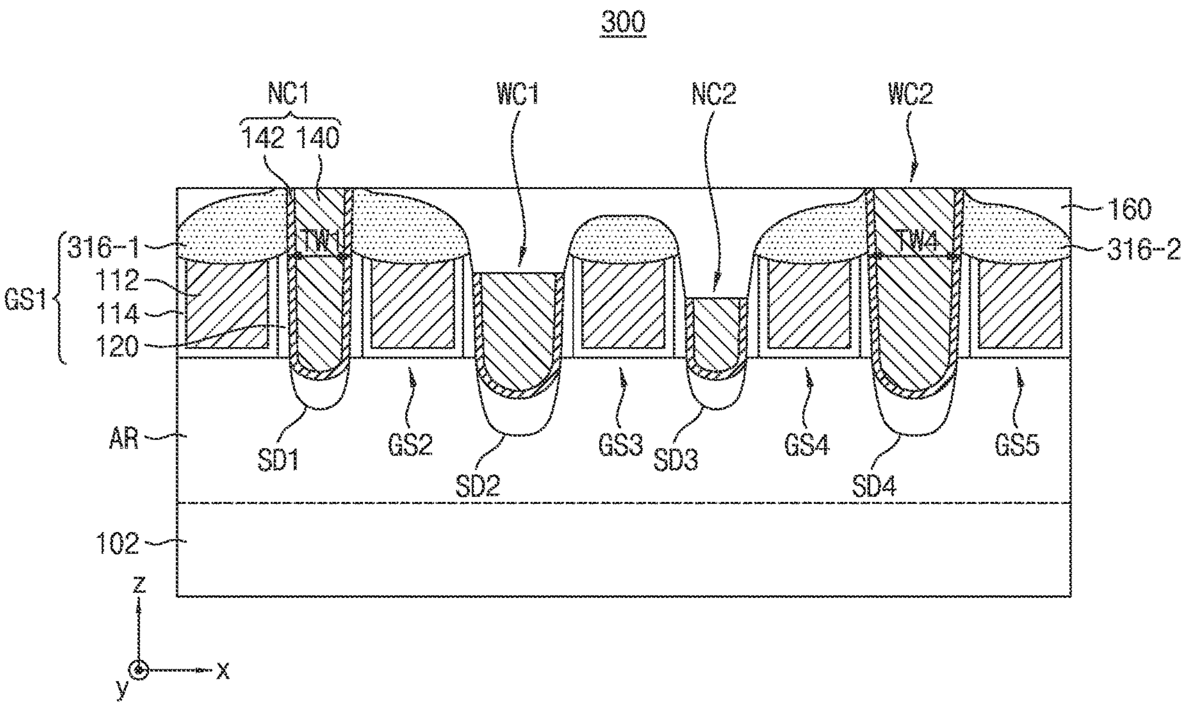
FIGS. 19 and 20 are vertical cross-sectional views of semiconductor devices according to exemplary embodiments of the disclosure.
Figure 20:
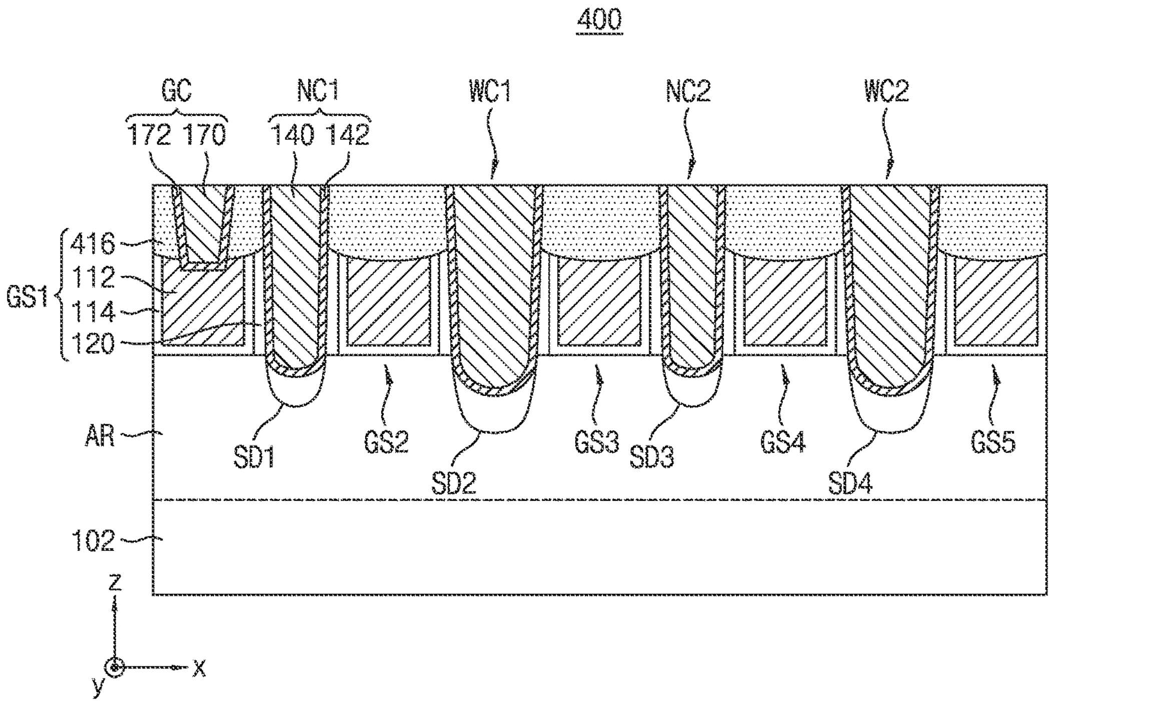

FIGS. 19 and 20 are vertical cross-sectional views of semiconductor devices according to exemplary embodiments of the disclosure.

Referring to FIG. 19, a semiconductor device 300 may include a first narrow source/drain contact NC1 and a second wide source/drain contact WC2 which are connected to first and fourth source/drain regions SD1 and SD4, respectively. FIG. 19 shows protrusion portions of the first narrow source/drain contact NC1 and the second wide source/drain contact WC2.

In cross-sectional view, upper surfaces of the first narrow source/drain contact NC1 and the second wide source/drain contact WC2 may be disposed at a higher level than an upper end of at least one of gate electrodes 112 and may be disposed at the same level as an upper surface of an interlayer insulating layer 160. In an embodiment, an upper horizontal width TW1 of the first narrow source/drain contact NC1 may be smaller than an upper horizontal width TW4 of the second wide source/drain contact WC2. Here, "upper horizontal width" means the horizontal width of a source/drain contact at the same level as the upper end of the gate electrode 112.

In the etching process described with reference to FIG. 15, a gate capping layer 116 contacting a source/drain contact having a relatively small horizontal width may be etched shallower than a gate capping layer 116 contacting a source/drain contact having a relatively great horizontal width. For example, the size of a gate capping layer 316-1 contacting the first narrow source/drain contact NC1 may be greater than the size of a gate capping layer 316-2 contacting the second wide source/drain contact WC2. At the same level as the upper surface of the first narrow source/drain contact NC1, the horizontal width of the gate capping layer 316-1 contacting the first narrow source/drain contact NC1 may be greater than the horizontal width of the gate capping layer 316-2 contacting the second wide source/drain contact WC2.

Referring to FIG. 20, a semiconductor device 400 may include a first narrow source/drain contact NC1, a first wide source/drain contact WC1, a second narrow source/drain contact NC2, and a second wide source/drain contact WC2 respectively connected to first to fourth source/drain regions SD1, SD2, SD3 and SD4. In an embodiment, a gate contact GC may be formed without execution of the etching process described with reference to FIG. 15. For example, upper surfaces of the first narrow source/drain contact NC1, the first wide source/drain contact WC1, the second narrow source/drain contact NC2, and the second wide source/drain contact WC2 may be disposed at the same level as an upper surface of a gate contact GC and upper surfaces of gate capping layers 116. The semiconductor device 400 may also include gate capping layers 416 covering the gate electrodes 112 and the gate insulating layers 114. Upper surfaces of the gate capping layers 416 are coplanar with upper surfaces of the first narrow source/drain contact NC1, the first wide source/drain contact WC1, the second narrow source/drain contact NC2, a second wide source/drain contact WC2, and the gate contact GC.

Figure 21:
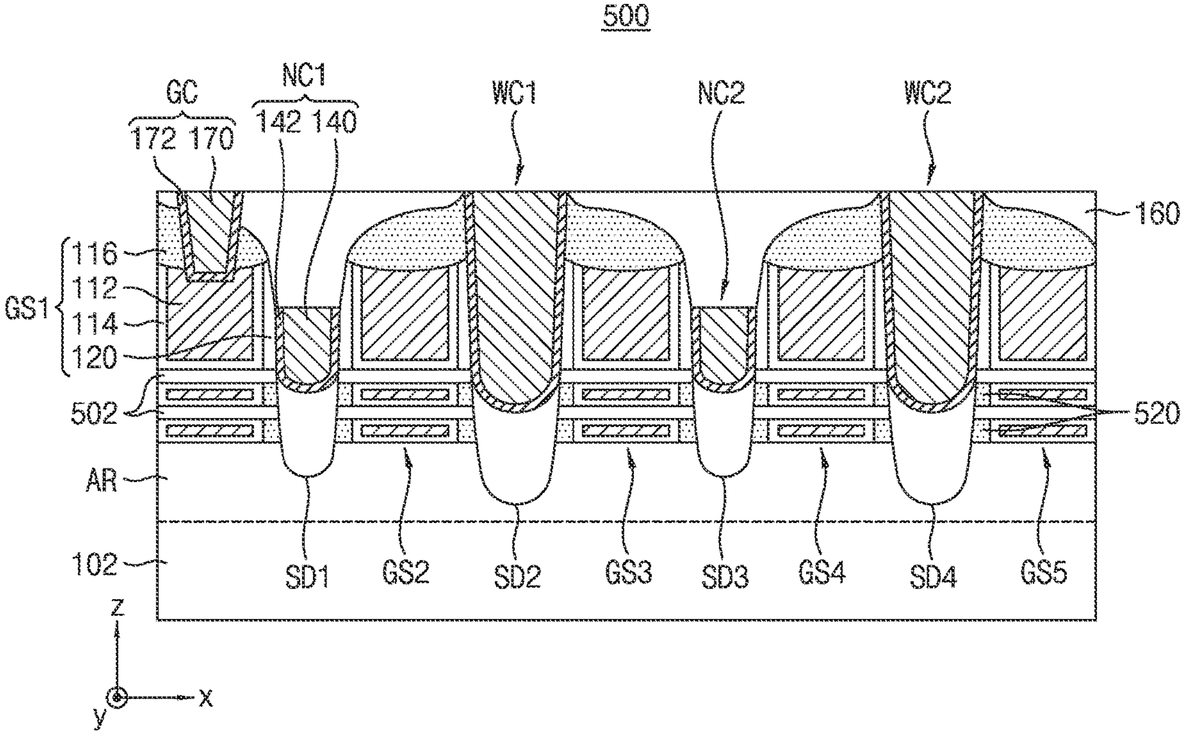
FIGS. 21 and 22 are vertical cross-sectional views of a semiconductor device according to an exemplary embodiment of the disclosure.
Figure 22:
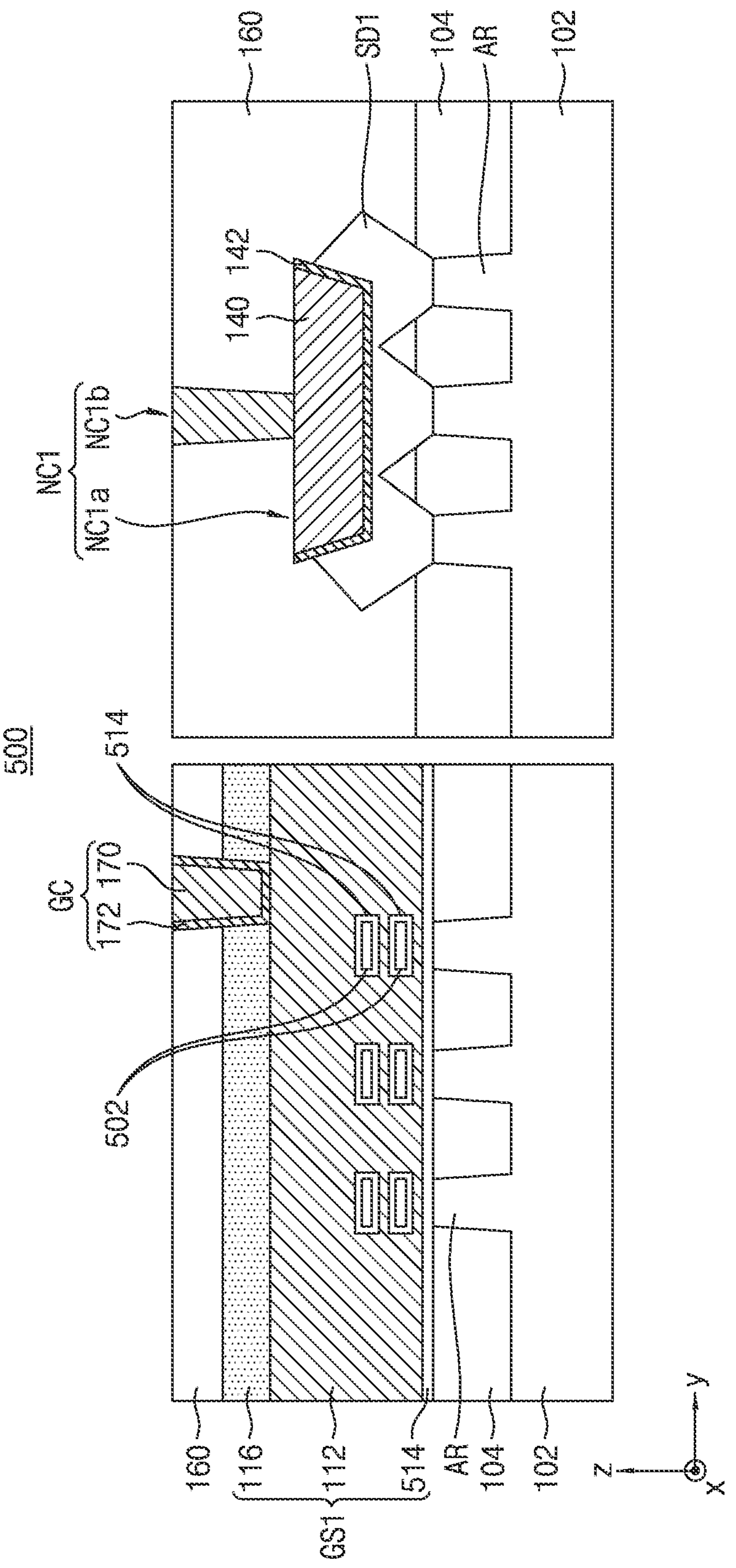

FIGS. 21 and 22 are vertical cross-sectional views of a semiconductor device according to an exemplary embodiment of the disclosure.

Referring to FIGS. 21 and 22, a semiconductor device 500 may include a multi-bridge channel field effect transistor (MBCFET®). For example, the semiconductor device 500 may include channel layers 502 disposed on an active region AR while being spaced apart from one another in a vertical direction. As shown in FIG. 22, the active region AR may protrude from an upper surface of a substrate 102 and may be disposed below a gate electrode 112. The channel layers 502 may be surrounded by a gate insulating layer 514 while being vertically spaced apart from the active region AR. In addition, the gate insulating layer 514 may cover upper surfaces of an element isolation layer 104 and the active region AR while extending in a y-direction. The gate insulating layer 514 surrounding the channel layer 502 may be surrounded by the gate electrode 112. As shown in FIG. 21, the channel layers 502 may interconnect source/drain regions adjacent to one another.

Although the channel layers 502 are shown in FIGS. 21 and 22 as having the form of a nano-sheet with a rectangular cross-section, the exemplary embodiments of the disclosure are not limited thereto. In an embodiment, the cross-section of the channel layer 502 may have a circular shape and an oval shape. In an embodiment, the channel layers 502 may include a group IV semiconductor such as Si, Ge, and SiGe or a group III-V compound such as InGaAs, InAs, GaSb, InSb, etc.

The semiconductor device 500 may further include inner spacers 520 disposed below the channel layers 502 while contacting opposite side surfaces of first to fourth source/drain regions SD1, SD2, SD3 and SD4. The inner spacers 520 may electrically insulate the gate electrode 112 from the source/drain region. In an embodiment, the inner spacers 520 may include silicon nitride.

In accordance with the exemplary embodiments of the disclosure, it may be possible to form a source/drain contact self-aligned with source/drain regions.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor device comprising:

an active region disposed on a substrate;

first to fourth gate structures sequentially disposed in a first horizontal direction and intersecting the active region, each of the first to fourth gate structures including a gate electrode and a gate capping layer on an upper surface of the gate electrode and a gate spacer on a side surface of the gate electrode;

first to third source/drain regions sequentially disposed in the first horizontal direction among the first to fourth gate structures;

a first narrow source/drain contact, a first wide source/drain contact and a second narrow source/drain contact sequentially disposed in the first horizontal direction among the first to fourth gate structures, the first narrow source/drain contact contacting the first source/drain region, the first wide source/drain contact contacting the second source/drain region, and the second narrow source/drain contact contacting the third source/drain region, wherein respective widths of the first and second narrow source/drain contacts, in the first horizontal direction, at a first height level, are smaller than a width of the first wide source/drain contact, in the first horizontal direction, at the first height level;

an interlayer insulating layer covering the first to fourth gate structures and the first to third source/drain regions; and a gate contact disposed on the first gate structure and electrically connected to the gate electrode of the first gate structure, wherein:

the first gate structure and the second gate structure are spaced apart from each other in the first horizontal direction by a first distance, the second gate structure and the third gate structure are spaced apart from each other by a second distance greater than the first distance, and the third gate structure and the fourth gate structure are spaced apart from each other by a third distance smaller than the second distance, a lower end of the first narrow source/drain contact is disposed at a higher level than a lower end of the first wide source/drain contact, the interlayer insulating layer contacts an upper surface of the first narrow source/drain contact and an upper surface of the gate capping layer of the first gate structure, and the gate spacer of the first gate structure contacts a lower surface of the gate capping layer of the first gate structure.

2. The semiconductor device according to claim 1, wherein the first height level comprises a level of an upper surface of the active region.

3. The semiconductor device according to claim 1, wherein a lower end of the first source/drain region is disposed at a higher level than a lower end of the second source/drain region.

4. The semiconductor device according to claim 1, wherein a height between the lower end of the first narrow source/drain contact and a lower end of the first source/drain region is smaller than a height between the lower end of the first wide source/drain contact and a lower end of the second source/drain region.

5. The semiconductor device according to claim 1, wherein the first narrow source/drain contact, the first wide source/drain contact and the second narrow source/drain contact overlap with the first to third source/drain regions along a vertical direction, respectively, and contact gate spacers of the first to fourth gate structures.

6. The semiconductor device according to claim 1, wherein:

a horizontal width between the first gate structure and the second gate structure at a same level as an upper surface of the active region is equal to a lower horizontal width of the first narrow source/drain contact, and a horizontal width between the second gate structure and the third gate structure at the same level as the upper surface of the active region is equal to a lower horizontal width of the first wide source/drain contact.

7. The semiconductor device according to claim 1, wherein a horizontal width of the first source/drain region is smaller than a horizontal width of the second source/drain region at a same level.

8. The semiconductor device according to claim 1, wherein:

the first narrow source/drain contact includes a first connection portion contacting the first source/drain region and a first protrusion portion protruding from the first connection portion in a vertical direction, the first wide source/drain contact includes a second connection portion contacting the second source/drain region and a second protrusion portion protruding from the second connection portion in the vertical direction, and an upper surface of the first connection portion is disposed at a lower level than an upper surface of the second connection portion.

9. The semiconductor device according to claim 8, wherein a height of the first connection portion is smaller than a height of the second connection portion.

10. The semiconductor device according to claim 8, wherein a height of the first protrusion portion is greater than a height of the second protrusion portion.

11. The semiconductor device according to claim 8, wherein an upper surface of the first protrusion portion and an upper surface of the second protrusion portion are disposed at a same level.

12. The semiconductor device according to claim 8, wherein the upper surfaces of the first connection portion and the second connection portion are disposed at a lower level than an upper end of the gate electrode of the first gate structure.

13. The semiconductor device according to claim 1, further comprising:

a fifth gate structure disposed opposite to the third gate structure with reference to the fourth gate structure;

a fourth source/drain region between the fourth gate structure and the fifth gate structure; and a second wide source/drain contact contacting the fourth source/drain region between the fourth gate structure and the fifth gate structure, wherein the interlayer insulating layer covers the fifth gate structure and the fourth source/drain region, and wherein:

the upper surface of the first narrow source/drain contact and an upper surface of the second wide source/drain contact are disposed at a same level as an upper surface of the interlayer insulating layer in a cross-sectional view, and a volume of the gate capping layer contacting the first narrow source/drain contact is greater than a volume of the gate capping layer contacting the second wide source/drain contact.

14. The semiconductor device according to claim 13, wherein a horizontal width of the gate capping layer contacting the first narrow source/drain contact is greater than a horizontal width of the gate capping layer contacting the second wide source/drain contact at a same level as the upper surface of the first narrow source/drain contact.

15. The semiconductor device according to claim 13, wherein an upper horizontal width of the first narrow source/drain contact is smaller than an upper horizontal width of the second wide source/drain contact.

16. The semiconductor device according to claim 1, wherein the upper surface of the first narrow source/drain contact, and upper surfaces of the first wide source/drain contact and the second narrow source/drain contact are disposed at a same level as an upper surface of the gate contact in a cross-sectional view.

17. A semiconductor device comprising:

an active region disposed on a substrate;

first to fourth gate structures sequentially disposed in a first horizontal direction and intersecting the active region, each of the first to fourth gate structures including a gate electrode, a gate capping layer on an upper surface of the gate electrode, and a gate spacer on a side surface of the gate electrode;

first to third source/drain regions sequentially disposed in the first horizontal direction among the first to fourth gate structures;

a first narrow source/drain contact, a first wide source/drain contact and a second narrow source/drain contact sequentially disposed in the first horizontal direction among the first to fourth gate structures, the first narrow source/drain contact contacting the first source/drain region, the first wide source/drain contact contacting the second source/drain region, and the second narrow source/drain contact contacting the third source/drain region, wherein respective widths of the first and second narrow source/drain contacts, in the first horizontal direction, at a first height level, are smaller than a width of the first wide source/drain contact, in the first horizontal direction, at the first height level;

an interlayer insulating layer covering the first to fourth gate structures and the first to third source/drain regions; and a gate contact disposed on the first gate structure and electrically connected to the gate electrode of the first gate structure, wherein:

the first gate structure and the second gate structure are spaced apart from each other by a first distance, the second gate structure and the third gate structure are spaced apart from each other by a second distance greater than the first distance, and the third gate structure and the fourth gate structure are spaced apart from each other by a third distance smaller than the second distance, a lower end of the first narrow source/drain contact is disposed at a higher level than a lower end of the first wide source/drain contact, in a cross-sectional view, the first narrow source/drain contact is lower than the gate electrode of the first gate structure and contacts the gate spacer of the first gate structure, and the first wide source/drain contact contacts the gate spacer and the gate capping layer of the second gate structure, the interlayer insulating layer contacts an upper surface of the first narrow source/drain contact and an upper surface of the gate capping layer of the first gate structure, and the gate spacer of the first gate structure contacts a lower surface of the gate capping layer of the first gate structure.

18. The semiconductor device according to claim 17, wherein a height between the lower end of the first narrow source/drain contact and a lower end of the first source/drain region is smaller than a height between the lower end of the first wide source/drain contact and a lower end of the second source/drain region.

* * * * *